United States Patent [19]

Finger

[11] Patent Number: 4,560,937
[45] Date of Patent: Dec. 24, 1985

[54] BATTERY STATE OF CHARGE METERING METHOD AND APPARATUS

[75] Inventor: Eugene P. Finger, Brewster, N.Y.

[73] Assignee: Curtis Instruments, Inc., Mount Kisco, N.Y.

[21] Appl. No.: 321,671

[22] Filed: Nov. 16, 1981

[51] Int. Cl.[4] ............................................. G01N 27/42
[52] U.S. Cl. ..................................... 324/433; 320/39; 320/48; 324/428; 324/435; 324/436; 340/636
[58] Field of Search ............... 324/426, 427, 428, 430, 324/429, 433, 435, 436; 340/636, 347 DA; 320/39, 48

[56] References Cited

U.S. PATENT DOCUMENTS

| | | | |
|---|---|---|---|
| 3,629,710 | 12/1971 | Durland | 340/347 DA X |
| 3,895,284 | 7/1975 | Schweizer | 324/428 |
| 3,932,797 | 1/1976 | York | 320/48 |
| 3,971,980 | 7/1976 | Jungfer et al. | 324/428 |
| 3,979,657 | 9/1976 | Yorksie | 340/636 |
| 4,028,616 | 6/1977 | Stevens | 324/29.5 |
| 4,052,717 | 10/1977 | Arnold et al. | 324/430 |
| 4,153,867 | 5/1979 | Jungfer et al. | 324/436 |
| 4,180,770 | 12/1979 | Eby | 324/429 |
| 4,193,026 | 3/1980 | Finger et al. | 324/428 |
| 4,388,618 | 6/1983 | Finger | 324/428 |
| 4,394,741 | 7/1983 | Lowndes | 324/427 |

FOREIGN PATENT DOCUMENTS

| | | | |
|---|---|---|---|
| 2742675 | 5/1979 | Fed. Rep. of Germany . | |
| 52-2264 | 1/1977 | Japan | 340/347 DA |

OTHER PUBLICATIONS

Fadrhons, J., "Simple Pulsewidth D/A Converter Accepts Bipolar Code", Electronic Engineering, Jan. 1974, p. 13.

Primary Examiner—Stewart J. Levy
Assistant Examiner—S. Baker
Attorney, Agent, or Firm—Curtis Ailes

[57] ABSTRACT

The system includes a digital integrator having a plurality of digital stages operable to store a numerical value in binary digital form which is indicative of state of charge. A switching circuit is provided for generating a series of voltage pulses on a single output line with each pulse corresponding in length to the binary digital value stored in the integrator to provide a time based resultant indication of the stored binary digital value. A filtering means is included to provide a substantially smooth analog output voltage having an amplitude corresponding to the summation of the pulses.

The system preferably includes a delayed high voltage reset feature to set the integrator to a full charge state in response to voltage levels accompanying charging of the battery.

24 Claims, 7 Drawing Figures

BATTERY STATE OF CHARGE METERING METHOD AND APPARATUS

The present invention relates to improved systems for monitoring the discharge condition of an electric storage battery such as a lead acid battery. The invention is particularly useful for conditions of operation where varying loads are intermittently applied to the battery.

BACKGROUND OF THE INVENTION

Many different approaches have been made to the problem of monitoring and indicating the discharge condition of electric storage batteries, especially in applications where the battery is first charged and then is used in the discharge mode for a considerable period of time, such as in a mobile vehicle, before it is again returned to the charger to be re-charged.

One valuable approach to this problem is to use an ampere-hour meter. Very accurate results have been obtained with such meters. However, accuracy is sometimes limited by the fact that the number of ampere hours obtainable from a battery depends very much upon the rate of discharge, fewer ampere hours being available when the battery is rapidly discharged. Furthermore, the ampere-hour meter approach requires insertion in the circuit of some means for measuring current, such as a current measuring shunt. That is not nearly so convenient as simply measuring the battery terminal voltage.

Various battery terminal voltage measurement systems have been employed for the purpose of monitoring battery discharge, with varying degrees of success. The present invention is in this category.

One voltage measurement technique for monitoring battery discharge consists of simply measuring the open circuit battery voltage. The stabilized open circuit battery voltage is a very accurate indication of the discharge state of the battery. However, it may take hours for the open circuit battery voltage to stabilize after each discharge interval, so that the stabilized reading is not available very much of the time. Furthermore, no open circuit battery voltage is available during a loaded condition of the battery.

Another approach is simply to measure and read the instantaneous battery terminal voltage on a continuing basis. However, this requires interpretation, since the terminal voltage varies during operation of the apparatus powered by the battery, having a depressed value during loading, dependent upon the magnitude of the load.

Various unidirectional systems have been devised for detecting and registering downward excursions in battery voltage under load, as an indication of the discharge condition of the battery. Some of these have operated on the basis of recognition of a sustained under-voltage condition before any registration is made, and others are really under-voltage analyzers which recognize and register under-voltage conditions in a setting recognizing previously registered under-voltage conditions. Very accurate results have been obtained with such systems, especially when applied to apparatus having known patterns of loading, even where the loading is quite discontinuous, such as in the operation of industrial forklift trucks. Examples of successful systems of this sort are disclosed in a prior U.S. Pat. No. 4,193,026 issued to Eugene P. Finger and Eugene A. Sands on Mar. 11, 1980 and assigned to the same assignee as the present application.

The present invention is an improvement upon the systems disclosed in the above mentioned U.S. Pat. No. 4,193,026. The present invention is most closely related to the system illustrated in FIG. 1 of that prior patent.

There are a number of separate objects of the present invention which may be separately listed as follows:

A. Greater economy of construction.

B. Greater economy and reliability of operation.

C. Improved accuracy of measurement.

D. Improved ease of calibration adjustment.

E. Automatic reset to the fully charged indication after charging, even when the battery has not been disconnected for charging.

F. More rapid and reliable testing of the system.

G. Provision of an improved visual indicator of charge condition.

Many other objects and advantages of the invention will be apparent from the following description and the accompanying drawings.

SUMMARY OF THE INVENTION

In carrying out the invention in one embodiment thereof there is provided a metering system for measuring and indicating the state of charge of an electric storage battery comprising a digital integrator including a plurality of digital stages operable to store a numerical value in binary digital form which is indicative of state of charge, said digital integrator being operable to change the numerical value stored therein in one direction in response to detected decreases in state of charge as the battery is being discharged, means connected to said integrator for deriving an analog output voltage signal proportional to the numerical value stored in said integrator comprising switching means for generating a series of voltage pulses on a single output line each corresponding in length to the binary digital value stored in a predetermined number of the highest order binary stages of said digital integrator to provide a time-based resultant indication of said binary digital value, and means for filtering said pulses to provide a substantially smooth analog output voltage signal having a voltage amplitude corresponding to the summation of said pulses.

In another aspect of the invention there may be provided a metering system for measuring and indicating the state of charge of an electric storage battery comprising a digital integrator to store a numerical value indicative of state of charge and operable to change the numerical value in one direction in response to detected decreases in state of charge as the battery is being discharged, an indicating means connected to receive signals indicative of the numerical value stored in said integrator and to provide a visual indication of that value, means for detecting a terminal voltage of the battery which is elevated into the battery charging range, a timing means connected for operation in response to said elevated terminal voltage detecting means and operable to reset said integrator to a value corresponding to a full state of charge after the terminal voltage remains elevated into said battery charging range continuously for a predetermined interval of time.

DESCRIPTION OF THE PREFERRED EMBODIMENTS

Figure 1:
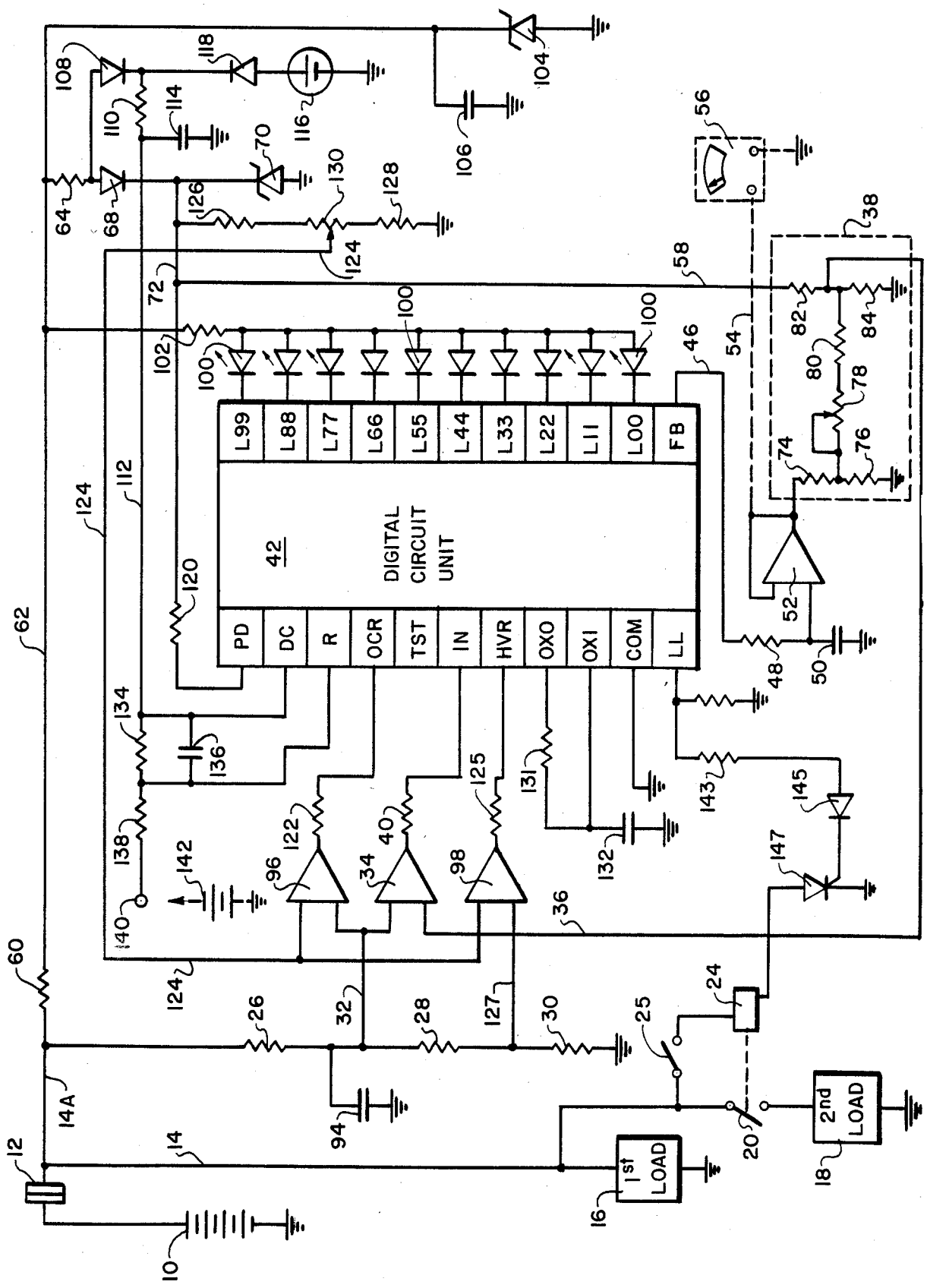
FIG. 1 is a schematic circuit diagram illustrating a preferred embodiment of the invention.

Referring more particularly to FIG. 1, there is schematically shown an electric storage battery 10 for which the metering system of the invention is to be used. The battery 10 may be connected, through a connector 12, and through a connection 14, to first and second loads 16 and 18. The connection to the second load 18 is through a control contactor having a contact 20 controlled by an electromagnetic winding 24. Winding 24 is controlled by a controller switch 25. The contactor 20-24 is also operable in a lock-out mode in response to the metering system, as will be described more fully below, to disconnect the second load 18 when the charge on the battery 10 is substantially depleted, as detected by the metering system. Contactor 20-24 is sometimes referred to below as a lock-out relay. The second load 18 may be a non-essential load, while the first load 16 may be an essential load which should not be disabled because of a low battery. In one practical application of the system, the first load 16 may represent the traction motor of an industrial forklift truck, while the second load 18 may represent the drive unit for the lift motors for the forklift truck. If the lift motors become inoperative, the forklift truck may still be returned to the charging station, since the traction motor (the first load 16) remains operative. It will be understood that the first and second loads 16 and 18 are only indicated schematically, and that individual load control switches (not shown) are provided for variation of speed and direction of operation.

All of the remainder of the apparatus illustrated in FIG. 1, and not as yet described, represents the metering system of the present invention. The metering system is connected to the battery 10 through connector 12 at connection 14A. A fixed fraction of the battery voltage at connection 14A is supplied from a voltage divider consisting of resistors 26, 28, and 30, through connection 32 to a threshold comparison amplifier 34. That fixed fraction of the battery terminal voltage is compared by the comparison amplifier 34 with a reference voltage supplied through a connection 36 from a reference voltage slope network 38, which is described more fully below. Whenever load is applied to the battery 10, the resultant downward excursion in the battery terminal voltage is detected by the comparison amplifier 34. If the downward excursion is below a threshold, as determined by the reference voltage on connection 36, a resultant signal is provided through amplifier load resistor 40 to the input terminal IN of a digital circuit unit 42.

The digital circuit unit 42 is shown in detail in FIG. 3, and is described in detail below. The digital circuit unit 42 includes a digital integrator which is operable to store a numerical value in binary digital form which is indicative of the state of charge of the battery 10. The digital integrator is operable to change its numerical value in one direction in response to detected decreases in the state of charge as the battery is being discharged. The input signal on the IN circuit is a signal which indicates to the integrator that there is a decrease in state of charge. The integrator is operable to integrate the time during which the input signal is present on the IN input terminal, and to change its numerical value in accordance with that integrated time.

The digital circuit unit 42 also includes switching means for generating a series of voltage pulses at the output terminal FB to output connection 46 at the lower right hand corner of the digital circuit unit 42. These voltage pulses respectively correspond in length to the binary digital value stored in the digital integrator within the digital circuit unit. The pulses are then filtered by a low pass filter combination consisting of resistor 48 and capacitor 50 to provide a substantially smooth analog output voltage signal having a voltage amplitude corresponding to the binary digital value stored in the integrator. That voltage is amplified by an operational amplifier 52 connected as a voltage follower amplifier. The resultant amplified output voltage optionally may be supplied through a connection 54 to a voltmeter 56 to thereby visually indicate the state of charge of the battery 10. The output from the voltage follower amplifier 52 is also supplied to the reference voltage slope network 38 so that the network 38 may generate a variable reference signal which is a function of the analog output voltage signal. The reference voltage is also determined in part by a substantially constant reference voltage signal which is available upon the input connection 58 to the reference voltage slope network 38.

The substantially constant reference voltage on connection 58 is derived indirectly from the battery 10 through connection 14A, and through a circuit including resistor 60, connection 62, resistor 64, diode 68, a substantially constant voltage drop Zener diode 70, and a connection 72 from the circuit node between diodes 68 and 70. It is because of the substantially constant voltage drop across the Zener diode 70 that the voltage at connection 58 is substantially constant.

It is apparent from an inspection of the resistor network 38 that, in the absence of an input to the network from the amplifier 52, the reference voltage output on connection 36 which sets the voltage threshold for the comparator amplifier 34 would be a constant fraction of the substantially constant reference voltage at connection 58, as determined by voltage divider resistors 82 and 84. However, the input from the amplifier 52 is operable to reduce the threshold voltage level at connection 36 as the discharge of battery 10 progresses, as recorded by the integrator contained within the digital circuit unit 42. This is appropriate since the terminal voltage of the battery 10 will decrease for each load current level as the discharge of the battery 10 progresses. Thus, the downward adjustment of the reference voltage threshold as a function of the battery discharge condition is appropriate in order to prevent faster integration than is warranted. The variable reference voltage may approximate the open circuit battery terminal voltage at the various states of discharge. The voltage supplied through amplifier 52 to the resistor network 38 may be characterized as a feedback voltage.

While the variable reference voltage slope resistor network 38 may take various forms, a preferred form is illustrated which consists of resistors 74, 76, 78, 80, 82, and 84 arranged generally in a configuration resembling a letter H, with the horizontal leg resistor 78 being variable in value. The bottom legs 76 and 84 are both connected to ground, and the top legs 74 and 82 are respectively connected to receive the feedback voltage and the constant reference voltage from connection 58.

In a preferred embodiment for industrial vehicle applications, the resistor values of the resistor network 38 are such that the full resistance value of the variable resistor 78 and the resistance values of each of the other resistances 80, 82, and 84 are about equal. The resistance values of the resistors 74 and 76 are substantially less, the resistance value of resistor 74 being approximately one-half that of resistor 80, and the resistance value of resistor 76 being a little over one-quarter of the resistance value of resistor 80. However, substantial changes may be required for other battery types or extremes in operating conditions.

The voltage output from amplifier 52 supplied to the network 38 is at its highest when the battery 10 is fully charged and when the system is registering a fully charged condition. However, the voltage relationships are such that the voltage at the circuit node between resistors 74 and 76 is always somewhat below the voltage at the node between the vertical leg resistors 82 and 84 so that the cross connection formed by resistors 78 and 80 causes a downward translation of the voltage at the node between resistors 82 and 84, which is the output voltage reference on connection 36. Adjustment of the variable resistor 78 changes this downward offset, reducing the resistor 78 increases the offset, and increasing the resistor 78 reduces the offset. As the system indicates a depletion of the charge, on the basis of the number stored in the integrator contained in the digital circuit unit 42, the voltage output level of amplifier 52 is reduced, and the reference voltage is correspondingly reduced, producing a sloping characteristic. This threshold reference voltage characteristic is illustrated in FIG. 2 as curve 86.

Figure 2:
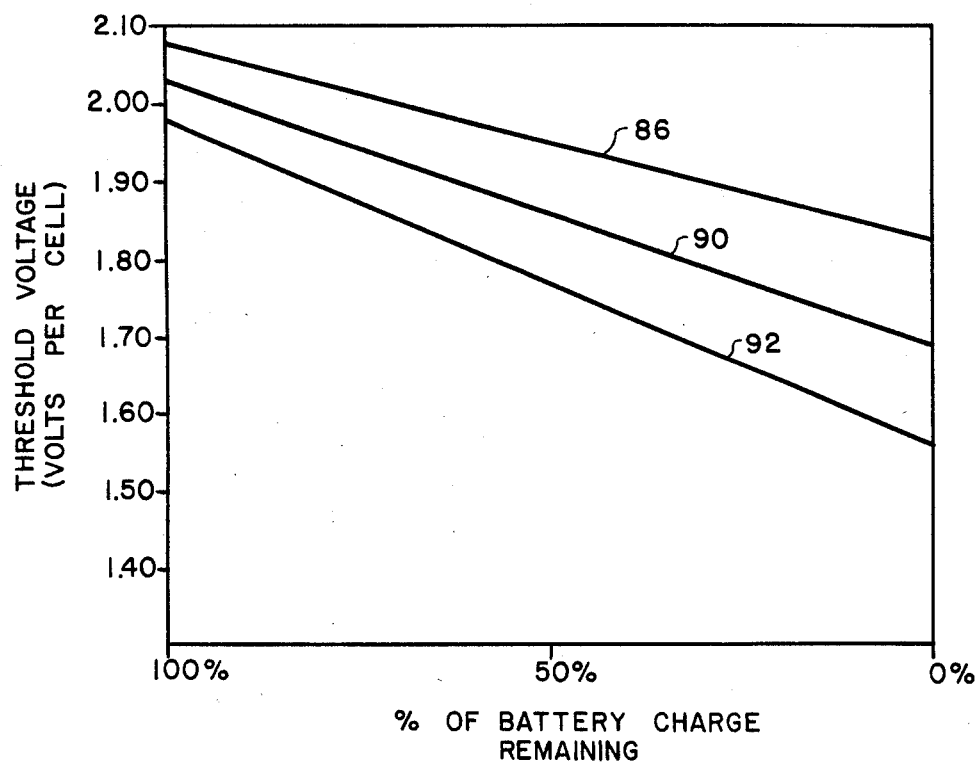
FIG. 2 is a graphic representation of the threshold voltage locus at which battery discharge conditions are detected by the system during the course of a full battery discharge cycle, with different locus curves representing different reference adjustments.

Curve 86 in FIG. 2 represents a plot of the threshold voltage output from the resistor network 38 on connection 36 versus the state of charge, as indicated by the numerical value stored in the integrator contained in the digital circuit unit 42. It will be seen that the voltage value slopes downwardly as the percent of charge remaining decreases. This is appropriate since the battery terminal voltage generally decreases as the charge is depleted, and therefore the resulting lower voltage excursions on load would look like heavier loads to the metering system. As a matter of fact, the normal decrease in open circuit voltage as charge is depleted might look to the metering system as though a load was continuously applied. Accordingly, in order to obtain an accurate measurement of the depletion of charge, based upon the detection of loaded conditions through terminal voltage measurements, it is preferred to reduce the measurement voltage threshold as battery charge is depleted.

Curves 90 and 92 illustrate the performance of the voltage threshold reference network 38 with greater vertical displacements caused by successive reductions in the variable resistance 78. It is a very useful feature of the network 38 that adjustments in the vertical displacement of the threshold voltage characteristic also provide an appropriate change in the slope of the characteristic. Thus, as illustrated in FIG. 2, as the characteristic illustrated in 86 is displaced successively downward, as shown at 90 and 92, the slope of the characteristic is also increased.

The main reason for providing the adjustments available from the adjustable resistor 78 to provide the different threshold voltage characteristics depicted in FIG. 2 is to accommodate for different objectives of different users in terms of battery life versus maximum battery energy output per charge. For maximum battery life, the battery is not discharged as deeply as it is for maximum energy output per charge. Accordingly, for a user who places the major emphasis on maximum battery life, the battery must be considered as fully discharged at a higher specific gravity per cell, and at a higher final battery terminal voltage than would otherwise be attained. For that user, the network 38 is adjusted to provide for the voltage threshold curve 86. For a user who desires to obtain more energy from the battery by discharging the battery more deeply, risking that consequent decrease in battery life, one of the other threshold voltage curves 90 or 92 will be selected by adjustment of resistor 78. When the threshold voltage characteristic is displaced downwardly, as illustrated by curves 90 or 92, it is appropriate that the slope should be increased, as illustrated in FIG. 2, because the deeper discharge will result in a greater decrease in battery terminal voltage as the battery charge is depleted.

It is to be seen from the curves of FIG. 2 that the variable reference voltage is a substantially linear function of the integrator analog output voltage signal.

Referring again to FIG. 1, and to the battery terminal voltage input circuits for the input amplifier 34, a capacitor 94 is preferably connected in parallel with the voltage divider resistors 28 and 30. Capacitor 94 operates with resistor 26 to provide a low pass filter on the battery voltage input to amplifier 34, as well as to the other amplifiers 96 and 98 which are discussed below. This filter prevents erratic operation of the system due to transient voltage "noise". Capacitor 94 also provides an initial delay in the operation of these amplifiers after the initial connection of battery 10.

The digital circuit unit 42, which is described in detail below in connection with FIG. 3, will be functionally described in connection with its operating functions in conjunction with the present FIG. 1. The digital circuit unit 42 preferably includes all of the digital logic circuits of the system, and is preferably, though not necessarily, fabricated as a single CMOS (complementary-metal-oxide silicon) integrated circuit chip having twenty-two terminals. In the present preferred embodiment, those terminals are each identified by codes which are often descriptive of the function served by the terminal. For instance, starting at the upper left hand corner of the drawing of the digital circuit unit 42, the first terminal labeled PD is an input terminal for detecting a power down condition which may result from removal of the battery 10 or disconnection of the battery 10 at the connector 12. The other terminals and their functions are listed below in tabular form as follows:

DC—An input for supplying DC power to the digital circuit unit.

R—An input connection for operating the integrator within the digital circuit unit at a faster than normal rate. This is normally used for test purposes.

OCR—An open circuit reset input for resetting the digital integrator to indicate a full charge when battery terminal voltage is re-established, after an open circuit, if the voltage is high enough to indicate that recharge has occurred.

TST—An input related to high voltage reset, the functions of which will be discussed in connection with FIG. 3. This is normally used for test purposes.

IN—The input terminal for receiving a voltage signal indicative of a discharge condition in terms of a battery terminal voltage level below a threshold (as already discussed above).

HVR—A high voltage reset input for resetting the integrator to a full charge condition if the battery terminal voltage is sustained at a sufficiently high level for a sufficient interval of time to indicate that the battery has been charged without disconnecting the battery from the system.

OXO & OXI—Terminal connections to an internal clock oscillator for the purpose of connecting components external to the digital circuit unit for the purpose of determining the oscillator frequency.

COM—A common circuit component connection to be connected to ground, as shown in the drawing.

LL—A load lockout output signal connection previously discussed above.

FB—A "feed-back" output connection for providing a time pulse coded DC output voltage indicative of the numerical value stored in the integrator within the digital circuit unit 42 (as previously discussed above).

L00 through L99—Output terminals for providing one out of ten digital output signals indicative of the state of charge numerical value stored in the integrator.

The one out of ten coded digital outputs from output terminals L00 through L99 are supplied to individual light emitting diodes 100 which provide a highly visible display representative of the numerical value stored in the digital integrator within the digital circuit unit 42, and thus indicate the state of charge of the battery. The light emitting diodes 100 are preferably arranged in a linear array so that as they are successively lighted, they simulate the movement of a meter pointer. This will be discussed more fully below. The output on the L99 terminal which lights the uppermost diode 100 indicates a full state of charge of the battery, and an output on the lowermost terminal L00 indicates an "empty" condition of the battery. The light emitting diodes 100 are all powered through a common return connection through resistor 102 to the power input connection 62.

The voltage on connection 62 derived from the battery 10 is stabilized by a Zener diode 104 shown at the right margin of the drawing, and by the filtering action of the combination of resistor 60 and the capacitor 106. The voltage connection for the supply of power to the digital circuit unit 42 is provided through resistor 64, and a diode 108, a resistor 110, and a connection 112. The combination of resistor 110 and an associated capacitor 114 provide further voltage filtering action for this supply voltage.

A standby battery 116 is connected to alternatively provide power through diode 118 and through resistor 110 to the digital circuit unit 42 when the main battery 10 is disconnected. Power is thus maintained for the digital circuit unit to maintain the storage of the accumulated count in the digital integrator included within the digital circuit unit even though the battery 10 is disconnected. This is very important because it is a common custom for operators of battery powered apparatus, such as forklift trucks, to completely disconnect the battery during rest periods and lunch periods or other periods of inactivity, without recharging the battery. Accordingly, the accumulated discharge condition measurement of the battery should be maintained so that the system will correctly indicate the state of charge of the battery when the battery is reconnected.

The normal terminal voltage of the standby battery 116 (plus 2 to plus 4 volts in a preferred embodiment) is below the normal voltage at the circuit node between the diodes 108 and 118 when the battery 10 is connected (plus 5 to Plus 8 volts in a preferred embodiment), so that the diode 118 is switched off, and there is no drain on the standby battery 116. The voltage level of the circuit node between diode 108 and 118 is indirectly stabilized by Zener diode 104, and more directly by the Zener diode 70, whenever the battery 10 is connected.

Because of the presence of diode 108, there is no back circuit for current from the standby battery 116 to supply power to any parts of the system other than the input terminal DC to the digital circuit unit 42. Accordingly, there is no unnecessary current drain from the standby battery 116. This principle is discussed more fully in connection with the internal circuitry of the digital circuit unit 42 in relation to FIG. 3 below. The standby battery 116 is preferably a primary cell lithium battery, such as a lithium manganese dioxide battery which has a long shelf life. Because of the measures described above, and the further measures described below to limit standby battery current drain, the life of the standby battery 116 is determined primarily by the battery shelf life, which may be in the order of five to ten years.

The presence of power from the battery 10 is detected by the digital circuit unit by detection of the voltage from connection 72 supplied through a resistor 120 to the PD (power down) input terminal. This is a logic function which is especially useful in the performance of the open circuit reset operation. For that operation, the output of amplifier 96 is supplied through a resistor 122 to the OCR input of the digital circuit unit 42. The amplifier 96 is an operational amplifier connected as a voltage comparator for comparing the voltage on connection 32, which is representative of the battery 10 terminal voltage, with a reference voltage supplied through a connection 124 from a voltage divider connected to the voltage supply connection 72. The voltage divider includes two fixed resistors 126 and 128, and a potentiometer 130. The potentiometer 130 is adjusted to provide a reference voltage to the amplifier 96 which is sufficient to provide a comparison output from amplifier 96 only when the terminal voltage of battery 10 is at an elevated level indicating that the battery has been previously connected to a charger. The digital circuit unit 42 includes logic circuits which check to see whether there is a logic input on the OCR terminal at a limited time window interval shortly after the re-establishment of a connection of the battery 10 after a prior disconnection of the battery 10 as detected by the input to the power down PD terminal. The digital circuit unit then causes the resetting of the integrator to the full charge indicating condition.

Resetting of the integrator can also be carried out by a logical input on the high voltage reset terminal HVR supplied from amplifier 98 through resistor 125. The same amplifier 98 preferably operates on the basis of the same reference voltage from connection 124 supplied from potentiometer 130 as was used for open circuit voltage reset. Accordingly, an adjustment of the potentiometer 130 adjusts the threshold for both the open circuit reset amplifier 96 and the high voltage reset amplifier 98. However, the high voltage reset amplifier 98 receives its voltage indicative of battery terminal voltage at a different connection 127 from the voltage divider 26, 28, 30, and at a position lower on that voltage divider. This means that the terminal voltage of battery 10 must be relatively higher to provide a logic output from the high voltage reset amplifier 98 than is needed to provide an output on the open circuit voltage reset amplifier 96. The purpose of the high voltage reset feature is to permit resetting of the integrator within the digital circuit unit 42 even though the battery has not been disconnected for the purpose of charging the battery. If the battery is charged in place, without disconnection, the battery terminal voltage achieves a substantially higher value during such charging than is experienced under other circumstances to which the system is exposed. The digital circuit unit 42 is operable to detect the high voltage condition through the terminal HVR, and to reset the integrator to the full charge condition only after the high voltage logic input on terminal HVR is sustained for a predetermined interval which is sufficient to indicate that the battery has indeed been charged in a substantial way, rather than merely subjected to a transient high voltage condition.

As previously mentioned above, the OXO and OXI terminals from the digital circuit unit are external connections to the clock oscillator within the digital circuit unit which permit the connection of external circuit elements, such as the resistor 131 and the capacitor 132 to thereby determine the frequency of operation of the oscillator. The values of these components 131 and 132 can thereby be adjusted to change the oscillator frequency, if desired. The frequency can be adjusted, or selected, over a wide frequency range from one hertz to one hundred kilohertz, as desired. A good practical frequency in the preferred embodiment is about three kilohertz.

The R (rate) input terminal to the digital circuit unit 42 is normally supplied with a positive (logic 1) input signal by reason of the connection to the power supply line 112 through a resistor 134. The input to the R terminal is stabilized by the presence of a capacitor 136 in parallel with resistor 134. The R input terminal is also connected through a resistor 138 to an external terminal 140. The value of the resistance 138 may be as much as twenty seven times the value of the resistance 134, so that, in order to provide a logic 0 input to digital circuit unit terminal R, it is necessary to supply a substantial negative DC voltage to the terminal 140. This may be done by means of a special test power supply 142 which is separate from the system. As previously mentioned above, the purpose of the R input terminal is to provide a means of operating the system rapidly, including rapid integration of the integrator contained in the digital circuit unit 42 for test purposes. The design of the input circuit to the terminal R, including the resistors 134, 138, and the requirement for a negative voltage source 142, is intended to prevent unauthorized tampering with the system which might provide a false indication of a battery discharge condition. Thus, the operator of a battery powered forklift truck will not normally have available a negative voltage DC power supply, and there is no way that he can cause an operative logic input to the R terminal of the digital circuit unit 42 by means of a positive voltage applied to terminal 140.

Output terminal LL from the digital circuit unit 42 normally provides a logic 1 output during operation of the unit. This logic 1 output is applied through a resistor 143 to a diode 145, from which it is supplied to the control electrode of an SCR device 147 which supplies current to the winding of relay 24. When the metering system indicates a battery discharge condition, digital circuit unit 42 provides a logic 0 output at the LL terminal, switching off gate of SCR 147, and locking out the contactor 24 when the contactor control switch 25 is next opened. This disconnects from the battery 10 the non-essential second load 18, which may be the motor for the forklift of a forklift truck. Meanwhile, the first load 16, which may be the forklift traction motor, remains connected so that the truck can be returned, under power, to a charging station. Other switching functions may be provided from the low battery (LL) signal, and switching devices other than the SCR may be employed. For instance, the signal may be used to simply slow down the lift instead of stopping it, and the switching device may be a reed relay, an optical coupler, or a transistor.

Figure 3:
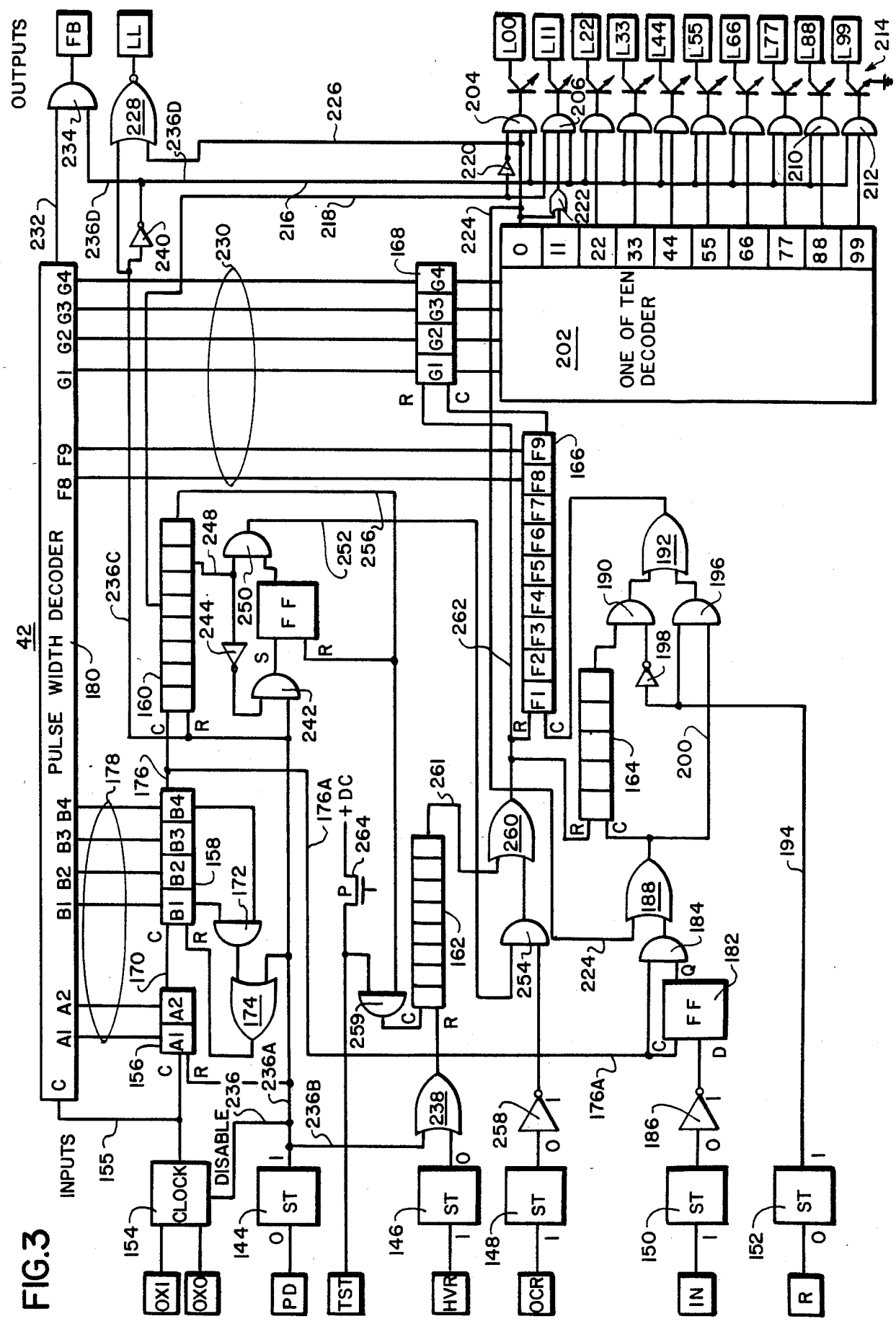
FIG. 3 is a schematic circuit diagram showing details of the digital circuit unit which forms a part of the system of FIG. 1.

FIG. 3 is a schematic logic diagram showing one implementation of the digital circuit unit 42 of FIG. 1. It will be understood that the logic illustrated in FIG. 3 can be carried out in other ways, using similar logic elements, without departing from the invention, and accomplishing the same results. It will be understood that additional logic gates and sequential clocking circuits may be employed in the digital circuit unit in order to insure fault free operation.

Connected immediately to the input terminals which are expected to receive analog DC voltage signals, the level of which may vary rather slowly, and over a relatively wide range, the digital circuit unit 42 includes separate Schmitt trigger circuits for the purpose of providing sharp and definite logic output signals at a relatively fixed level. Thus, the Schmitt trigger circuits 144, 146, 148, 150, and 152 are shown respectively connected to receive the signals from the input terminals PD, HVR, OCR, IN, and R. In each instance, the inverting output of the Schmitt trigger is used. Therefore, the Schmitt trigger is used as a voltage and logic inverter, as well as a Schmitt trigger. In this embodiment of this circuit, a value of about plus 5 volts is regarded as a logic "1", and 0 volts is regarded as logic "0". In the drawing for each of the Schmitt triggers, the logic input signal from the input terminal to the Schmitt trigger which provides the active function intended for that terminal is indicated by a 0 or a 1, and the resultant logic output from the Schmitt trigger is indicated by a 1 or a 0. Thus, when the power down state is detected through the PD terminal, a logic 0 is present at the input of Schmitt trigger 144, and a logic 1 output results from that Schmitt trigger. Similarly, when a high voltage reset input signal is available on terminal HVR, the result is a logic 1 input to Schmitt trigger 146, and a logic zero output results from that Schmitt trigger.

The Schmitt trigger circuits 144–152 also serve as voltage threshold detection circuits. This function is especially important with the HVR, OCR, and IN signals which consist of outputs from voltage comparison amplifiers.

The unit includes a system clock oscillator 154 which supplies clocking pulses, directly or indirectly, to the entire circuit, especially including a number of binary digital counters, including a two stage A counter 156, a four stage B counter 158, an eight stage C counter 160, an eight stage D counter 162, a five stage E counter 164, a nine stage F counter 166, and a four stage G counter 168. The individual stages of the A, B, F, and G counters are individually identified by the letter designation of the counter and the number of the stage. The F and G counters 166 and 168 serve as the integrator. All of the other counters provide various timing and commutating functions, as described in more detail below.

The clock 154 is preferably more than an oscillator, since it preferably includes a pulse former which provides sharp switching pulse signals to the clock input "C" of the A counter 156. The clock pulses are also provided on connection 155 to the clock input "C" of a pulse width decoder circuit 180.

The A counter receives the clock pulses on its C input to the first stage A1, and counts from "0" up to a value of 3, since it has four digital logic states. At the count of four, both stages A1 and A2 revert to the logic 0 condition, and at that time, a carry signal is supplied on connection 170 to the clock C input of the B counter 158 at the first stage B1. While the four stage B counter is capable of counting to a value of 16, it includes a special reset circuit, including an AND gate 172 and an OR gate 174 for resetting this counter at a count of 9. Thus, the AND gate 172 is connected to receive and respond to the combination of digital 1 outputs from stages B1 and B4 corresponding to a binary count of 1001, which corresponds to a decimal 9. The resultant output from AND gate 172 enables the OR gate 174, the output of which is connected to the reset R input of counter 158 to immediately reset that counter, and to thus provide an output signal pulse from the B counter 158 on connection 176 to the clock input C of the C counter 160. The combination of the count of 4 by the A counter 156 and the count of 9 by the B counter 158 causes a total count of 0 through 35 and a frequency division of the clock pulses from clock 154 by a factor of 36. The 0 through 35 count signals from the A and B counters are supplied in binary form on lines 178 to the pulse width decoder 180 for generating the pulse modulated DC output, as described more fully below.

The A and B counters 156 and 158 are sometimes referred to collectively below as a "clock counter".

The reduced frequency pulses at connection 176 at the output of the B counter are carried through a connection 176A to a trigger type flip-flop 182 and an AND gate 184. These components are arranged to receive and process the input signals from the IN input terminal. As shown at the input of Schmitt trigger 150, the active state of the input signal is a logic 1, resulting in a logic 0 output from the Schmitt trigger 150 to an invertor 186, which then provides a logic 1 input signal to the data input D (the set "input") of the flip-flop 182. The flip-flop 182 is of the triggered type, in which the C input is the trigger input, causing the flip-flop to assume the state dictated by the value on the data D input. When the value on the data D input first shifts from a logic "0" to a logic "1", then the next succeeding clock trigger input causes the flip-flop to go to the "set" state. Conversely, when the input signal on the data D input goes to a logic 0, the flip-flop 182 goes to the reset state upon receipt of the next succeeding clock trigger pulse.

The setting of flip-flop 182 causes a logic 1 output from the Q output terminal of flip-flop 182 to the lower input terminal of AND gate 184. The appearance of the Q output from flip-flop 182 is normally delayed slightly from the rising edge of the trigger clock pulse input to that flip-flop. Accordingly, it is upon the next succeeding falling edge of the clock pulse on connection 176A, that the AND gate 184 is effective to transmit a logic "0" transition to the succeeding OR gate 188. The logic "0" transistion is significant because that is the signal to which the succeeding counter responds. This, and succeeding clock pulses which continue during the continuation of the input signal and the continued set state of flip-flop 182, are thus transmitted to the clock input C of the counter 164, and the resultant output pulses from counter 164 are normally transmitted through AND gate 190 and OR gate 192 to the clock input C of the F counter 166. The output of the last stage F9 of counter 166 is connected to the clock input of the G counter 168. Thus, the pulses gated by the input signal through the flip-flop 182 are caused to count the combined integrator F and G counters 166 and 168, after frequency division by counter 164, to thereby record a time integrated function of the intervals of battery discharge. Since the frequency divider counter 164 has five binary stages, it is effective to divide the frequency by the factor of 32. Actually the frequency divider counter 164 can also be considered to be a part of the integrator, constituting the five lowest order binary stages.

When it is desired to test the portion of the system just described to see if it is operating properly, by rapidly integrating the input signal, a logic 0 signal is applied to the rate input R terminal, causing a logic 1 output from the Schmitt trigger 152 through connection 194 to an AND gate 196 and an invertor 198. The logic 1 to the inverter 198 provides a logic zero to gate 190, disabling that gate, while the logic 1 supplied to AND gate 196 enables that gate so that the pulses supplied through OR gate 188 are bypassed around the counter 164 by the connection 200 through the gate 196 to the OR gate 192. The integrator counters 166 and 168 are then caused to operate 32 times faster than normal, although the system is fully operative in a normal manner in every other respect, including the requirement that there must be a logic 1 input signal at the IN terminal.

While the R input is presented as an input for the purpose of rapid integration for test purposes, it will be apparent that still another analog threshold circuit could be used to feed the R input to detect deep discharge voltage reductions, indicating a rapid discharge rate, and that signal could be caused to energize the rate circuit to cause more rapid integration. It will be understood that such integration might not be desired to be as rapid as that provided (32 times as fast as normal), but this could obviously be adjusted by making the pulse divider counter 164 smaller, and making the counter 166 correspondingly larger.

The four highest order digit stages of the integrator G counter 168 are connected as shown to a one of ten decoder 202. Decoder 202 is a logic network which is operable to produce only one output on one of its ten output lines for each of ten different logic input combinations from the outputs of the G counter 168. The details of the decoder are shown more clearly in FIG. 5 and are described below in connection with that figure.

The decoder responds to output counts from G counter 168 corresponding to decimal counts 0 through 9 to produce the 1 out of 10 output signals corresponding to the values 0 through 99. However, since the integrator counter constituted by the counters 164, 166, and 168 counts up to record the progressive depletion of the battery, the sense of the outputs of the decoder 202 is reversed so that a count of 0 received by the decoder 202 from the counter 168 results in an output on the 99 value output terminal of the decoder, indicating a full charge. Successively higher numbers from the counter 168 received by the decoder 202 result in successively lower numbered outputs from the decoder, until finally, the reception of a nine count results in an output on the 0 output line. Thus, the outputs represent values which are numerical complements of the inputs.

The ten outputs from the one of ten decoder 202 are carried through AND gates 204 through 212, each of which switches one of the transistors 214 to provide the output signals to the output terminals L0 through L99 to energize the light emitting diodes 100 previously shown and described in FIG. 1. The outputs from the drivers 214 can also be used to drive other control elements, such as relays, if desired. The AND gates 204–212 are usually enabled by a logic 1 gating signal on a control line 216, the function of which will be described below in connection with the power down feature of the invention.

In accordance with a preferred feature of the invention, when the system provides a signal at the eleven level (almost fully discharged), the output terminal L11 is provided with an output which pulses on and off to provide a flashing indicator light to warn the operator. This is accomplished by supplying a pulsed logic "1" signal to the uppermost input of AND gate 206 through a connection 218 from the fifth stage of the continuously running timing counter 160. Similarly, a pulsed signal is supplied at the L00 terminal in response to the 0 (fully discharged) signal from the decoder 202. This again is accomplished by the intermittent pulse signals on connection 218, applied to the upper terminal of AND gate 204 through an inverter 220. Additionally, the signal on the 0 output from decoder 202 is fed through an OR gate 222 to AND gate 206. The OR gate also receives the 11 output from decoder 202. Thus, the AND gate 206 is provided with a decoder signal for either one of the outputs 11 or 0 from the decoder 202. This means that, for the 0 output from decoder 202, pulsed inputs are provided to both the L00 and the L11 terminals to cause both of the associated LED display devices to flash. However, since AND gate 204 is supplied with pulsed inputs through the inverter 220, and AND gate 206 is supplied with non-inverted pulses from the same source, the pulsed outputs alternate. This has two major advantages. One advantage is that the alternate flashing of the two LED's provides a noticeably different signal from the single flashing LED obtained when the metering device reaches the 11 level. The other advantage is that the LED driving circuit need not ever drive more than one LED at a time, which limits the peak output current.

The 0 (empty) output signal from the one of ten decoder 202 is also carried through a connection 224 back to the OR gate 188 to lock out that OR gate to prevent further clock pulses from reaching the integrator counters 164 or 166, to thus stop the integration. This lockout is effective because the constant logic "1" input is effective to prevent any transmission of pulses through OR gate 188 and the counters 164 and 166 are responsive only to pulses.

The 0 (empty) signal from decoder 202 is also carried through a connection 226 to a NOR gate 228 to provide a logic 0 output at the LL (load lockout) output terminal. The load lockout terminal normally has a logic 1 output, but is shifted to a logic 0 when the load lockout action is to occur, as previously discussed above in connection with FIG. 1.

The pulse width decoder 180 receives outputs on connections 230 from the six highest order stages of the integrator counters 166 and 168, which are designated F8, F9, and G1 through G4. These signals are operative with the clocking signals from A and B counters 156 and 158 (the clock counter) received on connections 178 to provide the basis for the operation of the pulse width decoder 180 to provide an output signal on connection 232. The signals on connection 232 are carried to a normally enabled AND gate 234, to thus provide the pulse width decoded output to the FB (feedback) terminal. The pulse width decoder 180 is shown and described in more detail below in connection with FIG. 4.

The power down-PD input signal, which operates through Schmitt trigger 144, accomplishes several functions. One of the main functions is to disable the clock 154 through connection 236, and to disable virtually every other circuit within the digital circuit unit 42 except for the counters 164, 166, and 168 which store the integrated value. This reduces the current drain from the standby battery 116 shown in FIG. 1 to a bare minimum necessary to maintain the storage of the accumulated information in the integrator. Pursuant to this objective, all of the other counters are reset by the PD input through connections 236A and 236B. The PD logic "1" signal on the 236B connection is effective through an OR gate 238 to the reset input of the D counter 162. The connection from 236A goes directly to the reset input of the A counter 156, and through OR gate 174 to the reset input of the B counter 158, and directly to the reset input of the C counter 160. The PD (power down) logic "1" signal continues from the reset input of counter 160 on connection 236C to the inverter 240 and also to the NOR gate 228. The resultant input to the NOR gate 228 provides a load lockout signal since it is appropriate that there should be a load lockout signal when there is no voltage being applied to the entire system. The logic 1 PD signal applied to the inverter 240 results in a logic 0 output signal on connection 236D to disable the AND gate 234 to terminate any FB output, and to disable all of the AND gates 204 through 212, to thereby disable all of the outputs to the terminals L00–L99 for the LED display devices.

The logic 1 PD (power down) output available on connection 236A is also carried to an AND gate 242, which is normally enabled at its upper terminal by an inverter 244. The resultant output from AND gate 242 is supplied to the set input terminal of a flip flop 246. That flip-flop remains set until after power is again reestablished on the circuit.

When power is again reestablished, the clock 154 again begins operation, and the counters 156, 158, and 160 also begin operation. When the count reaches the seventh stage of the C counter 160, the resultant output at connection 248, together with the subsisting set "Q" output of the flip-flop 246, enables an AND gate 250, which then supplies a logic 1 signal through a connection 252 to an AND gate 254. This provides a brief time window enablement signal for the open circuit reset function. The logic 1 signal remains on connection 252 only until the counter 160 counts up to provide an output on the next stage, at which time, the output on the seventh stage on connection 248 goes to logic 0 to disable the AND gate 250. Furthermore, when the carry signal output appears at the end of C counter 160, it is carried through connection 256 to the reset input of flip-flop 246, to thereby reset the flip-flop 246 to terminate the enabling input at the lower terminal of AND gate 250. Accordingly, the output from AND gate 250 on connection 252 will not again exist until after the power down condition is again detected to set the flip-flop 246.

During the existence of the time window enablement signal on AND gate 254, that AND gate is responsive to an open circuit reset threshold signal transmitted through the OCR terminal, and the Schmitt trigger 148, and an associated inverter 258. AND gate 254 is then effective to provide an output to an OR gate 260. The resultant signal at the output of gate 260 is a logic 1 on a connection 262 which resets all of the integrator counters 164, 166, and 168. Thus, if the battery terminal voltage is high enough to be in a range to indicate that the battery has been recharged, the resultant voltage threshold is detected at the Schmitt trigger 148, and during the time window of enablement of AND gate 254, the integrator counters are appropriately reset. In a preferred embodiment, the time window opens about three quarters of a second after connection of the battery, and closes at about one and one half seconds after connection of the battery.

If the battery 10 is charged without disconnection from the metering system, a substantially higher battery terminal voltage results during the course of charging, particularly if the charging continues for an interval long enough to substantially charge the battery. Such a voltage results in a logic 1 voltage being detected through the HVR input terminal by the Schmitt trigger 146. That results in a logic 0 output signal to the OR gate 238. Since the only other input to the OR gate 238 is from the PD Schmitt trigger, (a signal which is not present while a live battery is connected) there is then a logic 0 output from the OR gate 238 to the reset input of the D counter 162, permitting that counter to count up in response to clock pulses received from connection 256 through an AND gate 259. After the time delay provided by the counter 162, which is preferably about six minutes, a "carry" output signal is provided from the counter on connection 261 to the upper input of OR gate 260 to thus reset the integrator counters 164, 166, and 168 to the full charge condition (through the connection 262).

Whenever the high voltage reset input is not available at the HVR input terminal, the Schmitt trigger 146 provides a continuous logic 1 output to the lower input of OR gate 238, which holds the reset input of counter 162 at the logic 1 state, thus maintaining counter 162 in the reset state, and preventing it from counting out. Thus, this particular circuit is effective to reset the integrator only when a high voltage is detected continuously for an interval of six minutes provided by counter 162. While six minutes has been chosen as an appropriate interval for this operation, it will be understood that some other interval can be chosen. The important principle is that the high voltage reset should not occur based simply upon a momentary high voltage condition such as might result from switching transients or from an interval of regenerative braking of a vehicle supplied by the main battery.

The high voltage reset threshold voltage to which amplifier 98, and Schmitt trigger 146 respond, is preferably in the range from about 2.35 to 2.56 volts per battery cell for lead acid batteries for vehicular and industrial use. The corresponding threshold voltage for the open circuit reset is preferably in the range from about 2.00 to 2.18 volts per battery cell for such lead acid batteries.

The upper terminal of AND gate 259 is normally held at a logic 1 state by a circuit from the DC supply through a low current P channel MOS transistor 264. If it is desired to make a quick test of the high voltage reset feature, an exterior oscillator, which operates considerably faster than the clock pulse rate at the lower terminal of AND gate 259, can be connected to the TST input terminal. When this is done, the counter 162 receives a whole string of counting pulses every time the AND gate 259 receives a normal clock pulse from connection 256 on the lower input. Thus, counter 162 counts up more rapidly to provide the full operating test cycle of the high voltage reset feature. Instead of using an exterior oscillator for connection to the TST input terminal, the clock oscillator 154 can be connected from the OXO terminal to the TST terminal to provide the faster clock rate.

Figure 4:
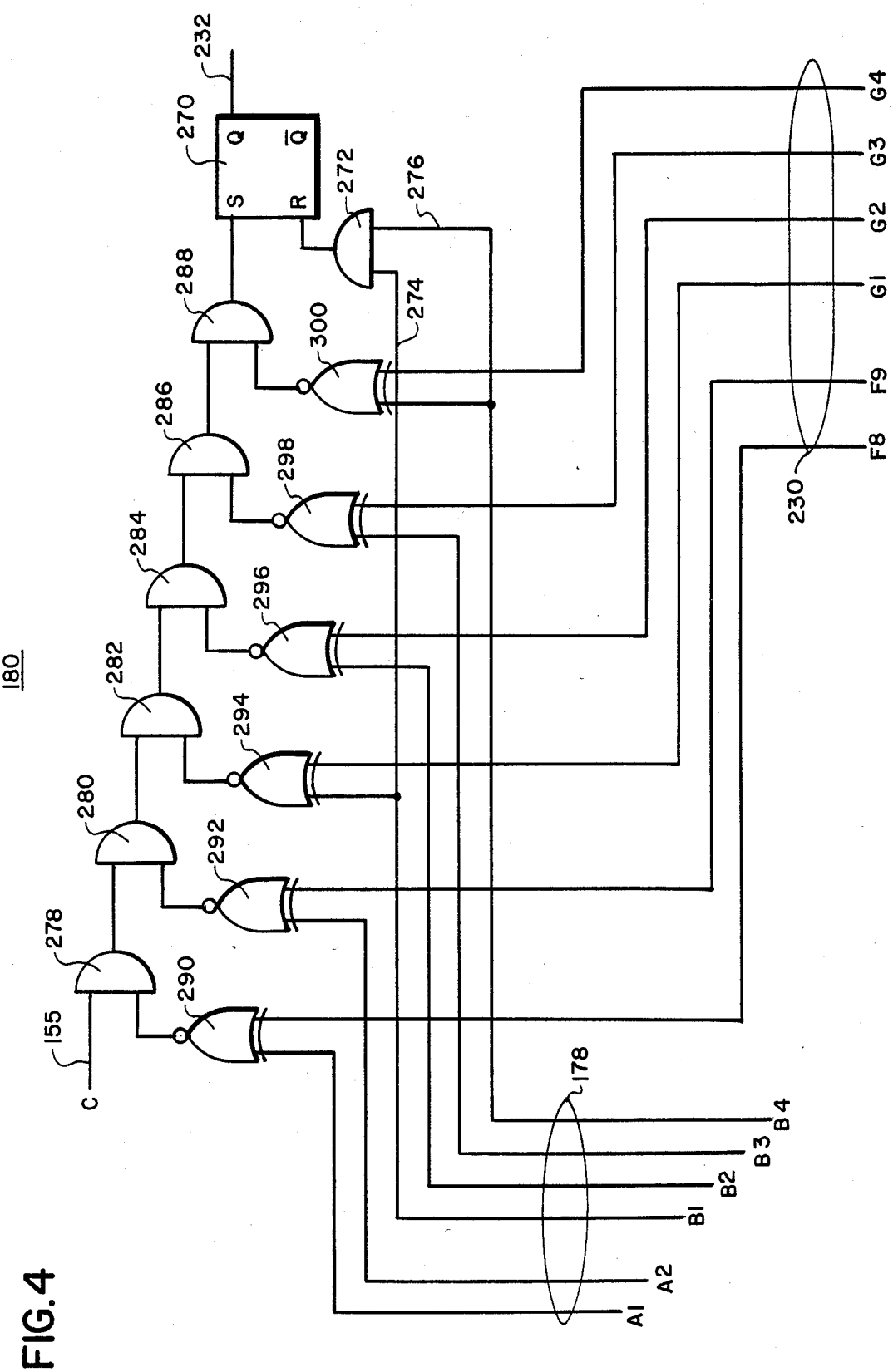
FIG. 4 is a schematic circuit diagram of a pulse width decoder which forms a part of the digital circuit unit of FIG. 3.

FIG. 4 is a schematic logic circuit diagram of the pulse width decoder 180, which forms a part of the digital circuit unit of FIG. 3. The accompanying Table 1, which appears below, shows the digital logic of the operation of the pulse width decoder.

TABLE I

OPERATION OF PULSE WIDTH DECODER

| F8 | F9 | G1 | G2 | G3 | G4 | FRACTIONAL DUTY CYCLE |
|---|---|---|---|---|---|---|
| 0 | 0 | 0 | 0 | 0 | 0 | 36 |
| 1 | 0 | 0 | 0 | 0 | 0 | 35 |
| 0 | 1 | 0 | 0 | 0 | 0 | 34 |
| 1 | 1 | 0 | 0 | 0 | 0 | 33 |
| 0 | 0 | 1 | 0 | 0 | 0 | 32 |
| 1 | 0 | 1 | 0 | 0 | 0 | 31 |
| 0 | 1 | 1 | 0 | 0 | 0 | 30 |
| 1 | 1 | 1 | 0 | 0 | 0 | 29 |
| 0 | 0 | 0 | 1 | 0 | 0 | 28 |
| 1 | 0 | 0 | 1 | 0 | 0 | 27 |
| 0 | 1 | 0 | 1 | 0 | 0 | 26 |
| 1 | 1 | 0 | 1 | 0 | 0 | 25 |
| 0 | 0 | 1 | 1 | 0 | 0 | 24 |
| 1 | 0 | 1 | 1 | 0 | 0 | 23 |
| 0 | 1 | 1 | 1 | 0 | 0 | 22 |
| 1 | 1 | 1 | 1 | 0 | 0 | 21 |
| 0 | 0 | 0 | 0 | 1 | 0 | 20 |
| 1 | 0 | 0 | 0 | 1 | 0 | 19 |
| 0 | 1 | 0 | 0 | 1 | 0 | 18 |
| 1 | 1 | 0 | 0 | 1 | 0 | 17 |
| 0 | 0 | 1 | 0 | 1 | 0 | 16 |
| 1 | 0 | 1 | 0 | 1 | 0 | 15 |
| 0 | 1 | 1 | 0 | 1 | 0 | 14 |
| 1 | 1 | 1 | 0 | 1 | 0 | 13 |
| 0 | 0 | 0 | 1 | 1 | 0 | 12 |
| 1 | 0 | 0 | 1 | 1 | 0 | 11 |
| 0 | 1 | 0 | 1 | 1 | 0 | 10 |
| 1 | 1 | 0 | 1 | 1 | 0 | 9 |
| 0 | 0 | 1 | 1 | 1 | 0 | 8 |
| 1 | 0 | 1 | 1 | 1 | 0 | 7 |
| 0 | 1 | 1 | 1 | 1 | 0 | 6 |
| 1 | 1 | 1 | 1 | 1 | 0 | 5 |
| 0 | 0 | 0 | 0 | 0 | 1 | 4 |
| 1 | 0 | 0 | 0 | 0 | 1 | 3 |
| 0 | 1 | 0 | 0 | 0 | 1 | 2 |
| 1 | 1 | 0 | 0 | 0 | 1 | 1 |
| 0 | 0 | 1 | 0 | 0 | 1 | 0 |

The vertical columns in Table 1 respectively labeled F8, F9, G1, G2, G3, and G4 contain the various logic values which can exist in the six highest order stages of the integrator. As shown in the last column entitled "Fractional Duty Cycle", each of these different logic values results in a different fractional duty cycle for the pulse width decoder, with the lowest binary value stored in the integrator (all zeros) representing the maximum fractional duty cycle of 36, which corresponds to a 100% duty cycle. The fractional duty cycle then changes in a complementary relationship to the corresponding binary numbers stored in the six highest stages of the integrator. This is clearly illustrated in Table 1, in which the next higher binary number is illustrated in each succeeding line of the table, together with the corresponding fractional duty cycle. It will be seen from the table, that as the binary numbers increase, the fractional duty cycle values decrease. Finally, when the value stored in the six highest digits of the accumulator correspond to the number decimal thirty six, as shown in the last line of the table, the fractional duty cycle is zero. This inversion (or complementation) of the fractional duty cycle with respect to the numerical value stored in the accumulator is appropriate since the feedback FB output from the pulse width decoder 180 must be inverted with respect to the count in the integrator when a high count is used to indicate full discharge, and a low count is used to indicate full charge.

Attention is directed again to FIG. 4, which is a logic schematic circuit diagram of the pulse width decoder 180 of FIG. 3. This drawing shows the clock input at 155, the clock counter 156, 158 inputs at 178, the six highest order digit inputs from the integrator 166, 168 at 230, and the pulse width decoder output at connection 232, all as previously shown and described in connection with FIG. 3. The circuit includes a flip-flop 270 which provides the variable width pulse at its Q (set) output on the output connection 232. The flip-flop 270 is reset through an AND gate 272 on each full cycle of the operation of the combination of counters A and B (156, 158) at the time when counter B stores a value corresponding to decimal nine. This coincides with a count of decimal 36 in the combination of counters A and B. This is determined by a coincidence of logic 1 inputs to gate 272 at connections 274 and 276 from the respective input connections 178 from stages B1 and B4 of the B counter. As a practical matter, since this detection of the 9 count in the B counter 158 coincides exactly with the logical function of the AND gate 172 of FIG. 3, the reset signal for flip-flop 270 can be obtained from that AND gate 172, instead of using a separate AND gate 272, as illustrated in FIG. 4. However, the separate showing of AND gate 272 in FIG. 4 promotes clarity in the presentation.

The flip-flop 270 is set through a cascaded chain of AND gates 278 through 288. These AND gates are operable to transmit the clock pulse input from connection 155 through the entire chain of AND gates to the set input of flip flop 270 whenever all six of the associated exclusive NOR gates 290 through 300 are operable to provide logic 1 gating outputs. This occurs only when there is an exact match between the six binary digit inputs 178 from the A and B clock counter 156, 158 and the six binary inputs 230 from the integrator F8, F9, G1, G2, G3, G4 counter stages. As shown in the drawing, each exclusive NOR gate is connected to compare corresponding binary digits from the two sources. Thus, exclusive NOR gate 290 compares the A1 and F8 digits while exclusive NOR gate 292 compares the A2 and F9 digits, and so on. It is a known principle that an exclusive NOR gate is a gate which provides a logic 1 output only when all inputs are either zeros or all inputs are ones—in other words a matching condition.

From the above explanation, it will be apparent that each pulse output from the pulse width decoder on connection 232 is started by setting the flip-flop 270 upon the achievement of a count by the combined output bits from clock counter A and B which matches the count stored in the accumulator stages. The pulse then ends upon the resetting of flip-flop 270 upon the achievement of the count value 9 by the B counter, corresponding to the highest possible count which is ever stored in the accumulator G counter. By this means, the duration of the pulse emitted by the pulse width decoder is always the complement of the number stored in the last six digit positions of the integrator. For instance, if the number stored in the integrator corresponds to decimal 2 (binary 010000), corresponding to the third line in Table 1, a match will be achieved early in the operation of the clocking counters A and B so that the flip-flop will be set early, and will remain on for 34 of the possible 36 fractional intervals of the duty cycle before it is reset by the achievement of a 9 count in counter B. By contrast, if a match is not detected until the achievement of a 9 count in counter B, indicating that the count in integrator counter G is at the 9 level, there will be no output at all from the flip-flop 270 because the reset signal from AND gate 272 will override the set signal from the matching gates to keep the flip-flop 270 from being set. This corresponds to the last line of Table 1.

It will be understood that, from a practical standpoint, additional logic gates and clock sequence pulses may be required to assure fault free operation at this final 9 count.

It will be apparent that if the complementary output was not desired, the set and reset input connections of flip-flop 270 could be reversed, or the output could be taken from the inverse output terminal Q. If both changes are made, the output is again the complement value.

Figure 5:
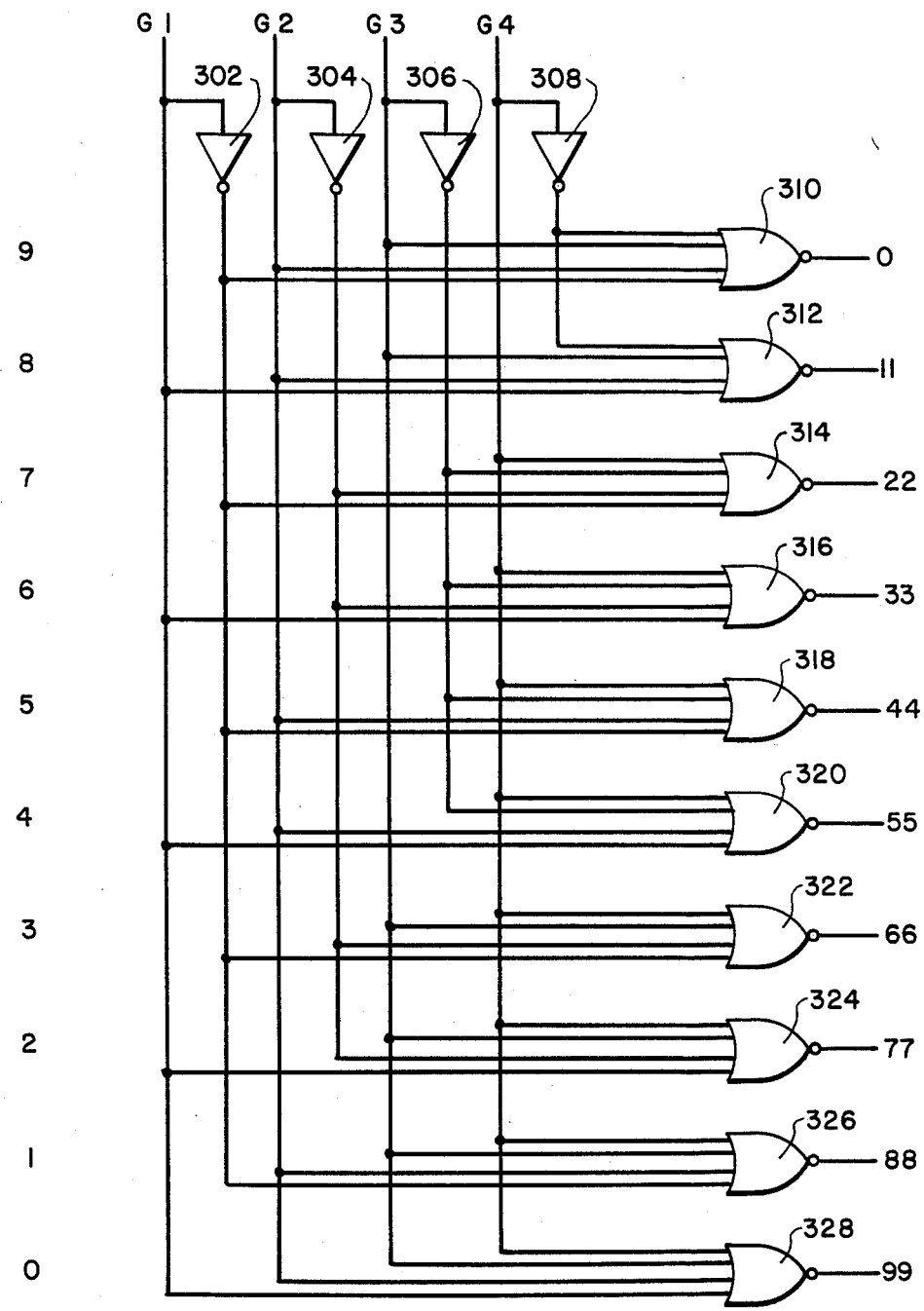
FIG. 5 is a schematic circuit diagram of a one out of N decoder circuit which forms a part of the digital circuit unit of FIG. 3.

FIG. 5 is a schematic circuit diagram of a preferred embodiment of the one out of ten decoder 202 of the digital circuit unit of FIG. 3. The digital outputs from the G counter 168 of the integrator enter the decoder at the top, as indicated at G-1, G-2, G-3, and G-4. As indicated by the invertors 302, 304, 306, and 308, the inverted function of each of the digital outputs is also available in the one out of ten decoder. The G counter 168 is preferably designed to provide both the direct and the inverse outputs so that actual inverters such as 302–308 are not necessary.

These direct and inverted outputs are decoded individually for the separate decimal values by the NOR gates 310 through 328. These NOR gates provide a logic 1 output only if all of the inputs are logic 0. Accordingly, by using inputs which are all the logical inversions of the value to be decoded, the correct result is achieved. Thus, for instance, NOR gate 310 is to be used to detect the presence of a number corresponding to decimal nine. Accordingly, the logically inverted signals from G-1 and G-4 supplied through inverters 302 and 308 are connected to NOR gate 310. These logic values should both be zero. At the same time, the direct logic values of the inputs G-2 and G-3 are supplied to NOR gate 310. All of these inputs should be logic zero for the condition of a decimal nine count. Accordingly, when that condition is achieved, NOR gate 310 provides a logic 1 output. The output signals are complementary, that is, they have nominal values which are complementary to the actual numbers stored in the G counter. Thus, the storage of a number 9 corresponds to zero output, and the storage of a zero corresponds to a 99, or "full", output. The decimal numbers corresponding to the binary output signals from the G register are listed at the left in the drawing opposite to the NOR gates which are decoding those numbers. Thus, each NOR gate decodes its assigned decimal number, but indicates a complementary value as indicated to the right of the outputs from the NOR gates 310 through 328.

It will be understood that logic AND gates could be used in place of the NOR gates 310–328, reversing the polarities of all of the inputs. However, in a preferred physical embodiment, NOR gates were used instead.

Figure 6:
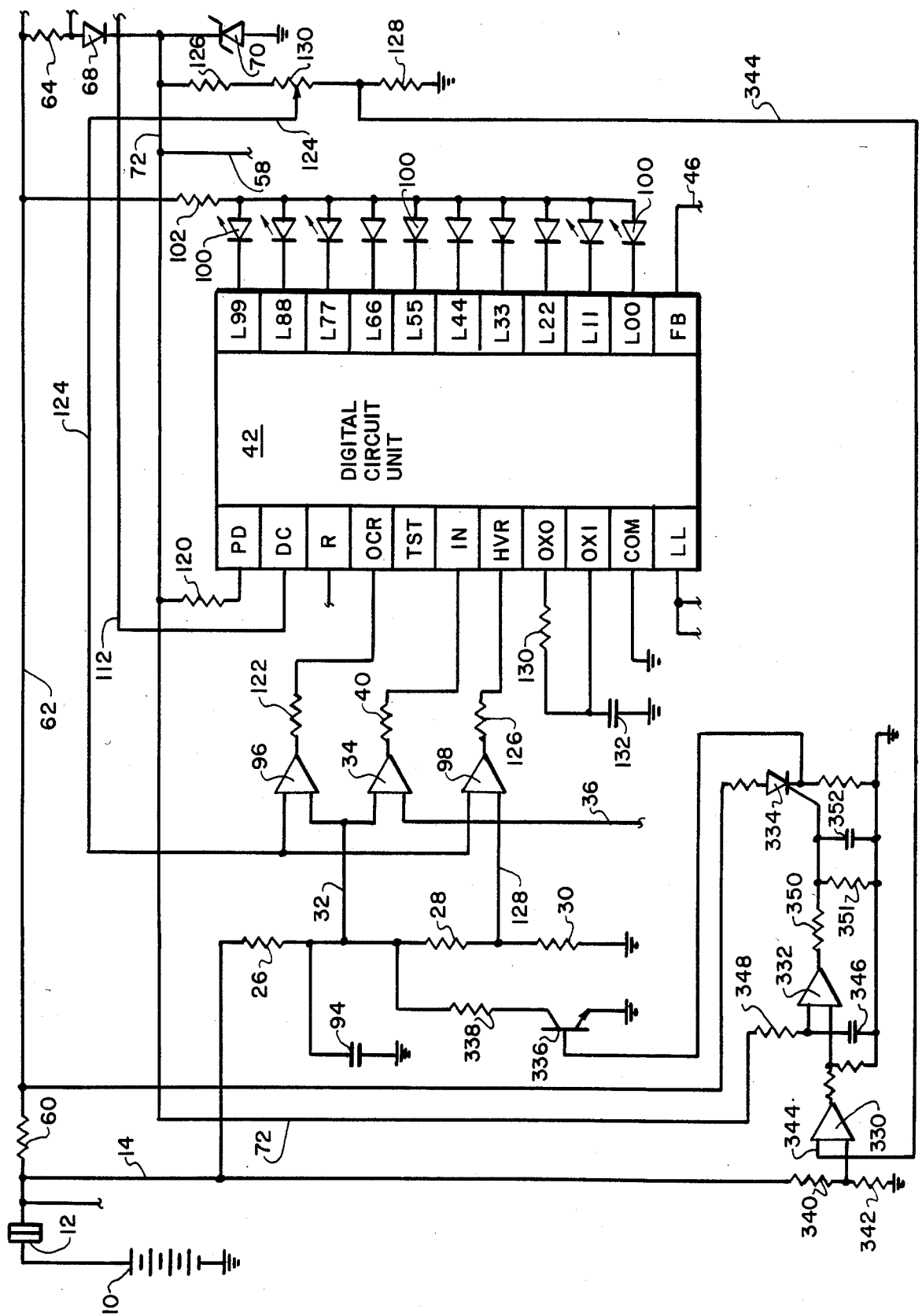
FIG. 6 is a schematic circuit diagram which represents a modification of the system of FIG. 1 for the purpose of providing an automatic adjustment of the voltage range of the system to accommodate for batteries having different rated voltages.

FIG. 6 is a schematic circuit diagram which represents a modification of the system of FIG. 1 for the purpose of providing an automatic adjustment of the voltage range of the system to accommodate for batteries having different rated voltages. It is sometimes referred to below as an automatic range switching circuit. Some electric vehicles, such as forklift trucks, are designed to be operable with batteries having either of two different rated voltages, and to operate satisfactorily with either battery. For instance, some such trucks are designed for operation on either 48 volt batteries or 36 volt batteries. This, of course, raises a problem in the operation of voltage responsive battery charge condition metering systems, such as those described in the present patent application, because those systems rely upon precise measurements of battery terminal voltage. The normal means for handling this problem is to ask the operator of the vehicle, or the service man who installs the batteries, to manually shift a switch to provide different voltage divider ratios depending upon which battery is installed. According to the features of the embodiment of the invention illustrated in FIG. 6, the metering system automatically recognizes which voltage battery has been installed in the vehicle, and automatically adjusts the voltage divider, if necessary, to accommodate for the battery terminal voltage in order to make the correct voltage measurements for operation of the metering system.

FIG. 6 corresponds closely to FIG. 1, repeating many of the system components of FIG. 1 for purposes of orientation, but omitting many of the details of FIG. 1 in order to simplify FIG. 6. It will be understood that all of the various features of FIG. 1, which have been omitted are intended to be included in FIG. 6, or may be included if they are optional features.

The special added components related to the automatic voltage range adjustment feature are all shown in the lower left hand portion of the FIG. 6 drawing. The principal ones of these components include a voltage comparison amplifier 330, an intermediate amplifier 332, an SCR 334, and a voltage range switching transistor 336.

The system is operable to automatically change range, when necessary, to accommodate for two different nominal battery voltages. In the instance for which the circuit was specifically designed, those two voltages are 36 volts and 48 volts. When the system is operated on 36 volts, the components including the amplifiers 330, and 332, and the SCR 334, and the transistor 336 are not switched, since no adjustment is necessary. In other words, the system is designed to operate at 36 volts without the necessity for adjustment.

The operation of the automatic range adjustment circuit may be described very briefly as follows:

When the battery 10 is initially connected, or reconnected, the amplifier 330 senses if the battery terminal voltage is above the nominal 36 volt level and into the range anticipated with a nominal 48 volt level. It then switches on the amplifier 332, which switches on the SCR 334, which switches on the transistor 336, to establish an auxiliary connection to ground through a resistor 338. The resistance shunt provided by connection of resistance 338 around the voltage divider resistors 28 and 30 serves to modify the input voltage divider including the resistor 26. This reduces the fraction of the battery terminal voltage which is sensed by the comparison amplifiers 34, 96, and 98. Thus, the correct voltages are sensed by these comparison amplifiers, even though the battery terminal voltage is higher.

In order to accomplish the initial voltage comparison at comparison amplifier 330, a separate voltage divider consisting of resistors 340 and 342 is provided and connected at 14 to the battery terminal voltage input. The node between resistors 340 and 342 is the point of connection for the lower input to amplifier 330. The voltage comparison is made in amplifier 330 to a reference voltage supplied through a connection 344 from the node between reference voltage divider resistors 128 and 130. The resulting output from amplifier 330 is supplied to the lower input of amplifier 332. The upper terminal of amplifier 332 is initially at a potential at or near ground so as to make the output of amplifier 332 initially high. That upper input terminal is connected to a circuit node between a capacitor 346, the other end of which is grounded, and a resistor 348, the other end of which is connected to the power down detection bus 72. The function of the circuit including capacitor 346 and resistor 348 will be discussed below.

The output of amplifier 332 is connected through a resistor 350 to the control electrode of the SCR 334. However, a resistor 351 and a capacitor 352 are connected in parallel between that control electrode and ground. The circuit constants of resistors 350 and 351 and capacitor 352 are selected so as to provide a substantial time delay of 50 to 100 milliseconds from the initiation of connection of the battery, and conduction of SCR 334, until capacitor 352 is charged to a voltage sufficient to trigger the SCR 334 into conduction to thereby initiate conduction of the transistor 336.

The automatic range adjustment feature of this modification of the invention is called upon to automatically adjust the range of the metering system only immediately after the initial connection of the battery to the system. It is desirable therefore to delay the operation of the automatic range adjustment circuitry, for at least 50 to 100 milliseconds, to allow the operation of the components of the system to settle down after the initial circuit transients which may result from switching the battery into the circuit. The time delay provided by resistors 350 and 351 and capacitor 352 accomplishes this time delay.

However, the automatic range adjustment circuit must operate shortly after the battery 10 is connected to distinguish the presence of a 48 volt battery, which requires adjustment, from the 36 volt battery which does not requires adjustment. It is important that the automatic range adjustment circuit must be operated before other circuits of the system, such as the open circuit reset circuit, including comparison amplifier 96, become operable in order to maintain system accuracy. The input filter comprised of resistor 26 and capacitor 94 for the voltage divider network 26, 28, and 30 provides a time delay in the rise time of the voltages present at the circuit node connection 32, and the connection 128 to the comparison amplifiers 96, 34, and 98. The value of the capacitor 94, and the resistor 26 and associated circuit components, provide a rise time of the voltage available at circuit connection 32 for the open circuit reset of about 150 milliseconds. This is not enough longer than the time delay provided by the automatic range adjustment circuit to prevent a false open circuit reset. However, as previously explained in connection with FIG. 3, the open circuit reset is not permitted to be effective except during a time window interval of from 750 to 1500 milliseconds after the initial connection of the battery. Accordingly, as long as the automatic range adjustment operation of the SCR 334 and the transistor 336 occurs well before the 750 millisecond interval, false operation of the open circuit reset is prevented. This is important because, until the automatic range adjustment is complete, the 48 volt battery will tend to cause an abnormally high voltage at the voltage detection input connection 32 to the comparison amplifier 96, even though the 48 volt battery may be substantially, or fully discharged.

If a 36 volt battery is connected to the system, it is very important that the automatic range adjustment circuit should not ever be actuated due to temporary overvoltage conditions of the system, which could arise from regenerative braking or from other transient conditions. In order to prevent the possibility of any such occurrence, and in order to limit the initiation of the operation of the automatic range adjustment circuit to an interval immediately after the initial connection of the battery 10, a timed lockout function is provided by the combination of the amplifier 332, the capacitor 346, and the resistor 348. When system voltage is first brought up, there is a resultant voltage on the power down detection bus 72 which is connected to the upper end of resistor 348. However, this voltage does not initially appear upon the upper input of amplifier 332, because that input is held close to ground potential by the capacitor 346. Accordingly, it is not until capacitor 346 becomes charged through resistor 348 from the bus 72 that the voltage rises on the upper input of amplifier 332 to shut off that amplifier. When the voltage does rise sufficiently to shut off amplifier 332, the auto range system is locked out, and thereafter incapable of initiating operation. The time interval for this lockout is preferably from 200 to 250 milliseconds. However, if the automatic range adjustment circuit operation has already been initiated, the SCR 334 is sustained in the conducting condition, keeping transistor 336 on, and maintaining the alteration in the range for the 48 volt battery in spite of the lock-out at amplifier 332.

The timing of the operation of the circuits just described, particularly involving the timing functions related to the capacitors 346, 352, and 94, may be summarized as follows:

Upon initial start up of the system by connection of the battery 10, if the presence of a 48 volt battery is detected at the comparison amplifier 330, the amplifier 332 is caused to trigger the SCR 334 after a time delay of 50 to 100 milliseconds. However, if the presence of the 48 volt battery is not detected within the interval of 200 to 250 milliseconds, the lockout circuit including the amplifier 332 is operable, to prevent conduction through amplifier 332, and to prevent any later initiation of the operation of the SCR 334. Thus, it may be said that there is a "time window" in an interval beginning from 50 to 100 milliseconds after connection of the battery and ending 200 to 250 milliseconds after connection of the battery for operation of the automatic range adjustment circuit. Finally, in the time window interval from 750 to 1500 milliseconds, if the voltage at the input connection 32 to the open circuit reset amplifier 96 has reached a level high enough to indicate a fully charged condition (for either a 36 volt battery, or for a 48 volt battery), the integrator is reset.

While the preceding explanation relates entirely to an automatic range adjustment circuit in which the system is designed to initially respond correctly to a lower voltage battery, and to make an adjustment when a higher voltage battery is detected, it will be obvious that the circuit could be designed to respond correctly to the higher anticipated voltage, and to initiate an adjustment when the presence of a lower voltage battery is detected. The correction is then in the opposite sense, and can be carried out by switching a shunt resistor into a parallel connection with the voltage divider resistor 26.

While 36 and 48 volt batteries have been discussed, it is obvious that the principles of this feature of the invention can be employed with any predetermined alternate voltage combinations.

Figure 7:
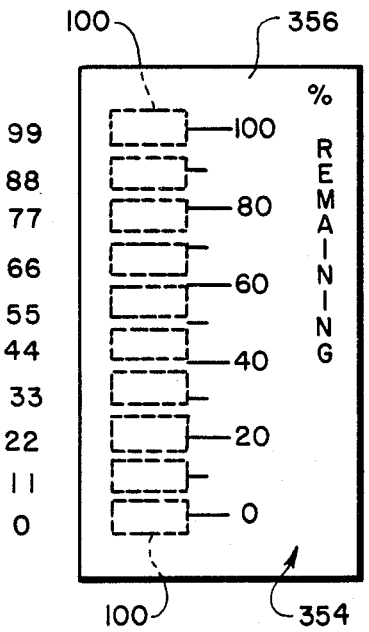
FIG. 7 is a front view of a preferred embodiment of a visual indicator device array for use in the system of FIG. 1.

FIG. 7 is a representation of a meter face 354 for use with the light emitting diodes 100. In FIG. 7, the visible lighted apertures of the diodes 100 (which are lighted one at a time) are shown in dotted outlines, and the precentage value represented by each diode is indicated by the numbers 0 through 99 in the column of figures shown to the left of the meter face 354. The meter face preferably includes a linear scale which runs from 0 to 100 at 10 percent graduations, as shown at 356. As illustrated in FIG. 7, the light emitting diodes 100 are combined in an array containing ten separate diodes arranged in an optical display with the illumination from each diode being in a relatively narrow rectangular shape. As further illustrated in the drawings, the longer sides of the rectangular shapes for adjacent diodes are arranged adjacent to one another, and the short sides of the rectangular shapes for each diode are arranged in substantial alignment with the corresponding short sides of adjacent diode display rectangles. In this configuration, the sequential lighting of the diodes, as the battery discharges, simulates the movement of the needle in a galvanic meter, and in particular, it simulates the display of a meter of the so called "edge" type, in which the end of the meter needle is bent over around the edge of the periphery of the meter, and that bent needle end is the visible portion of the galvanic meter needle.

The meter scale 356 is arranged adjacent to the diode array so as to be readily visible along with the diode display. Since there are basically eleven markings on the scale, corresponding to the values 0, 10, 20, and at steps of 10 up to 100, and there are only ten light emitting diodes, which are spaced over the same total scale distance, the center to center spacings of the light emitting diode apertures are different from the spacings of the scale markings. This has been found to further enhance the simulation of a galvanic meter as the light emitting diodes are successively lit.

It will be understood that the linear array of light emitting diodes may be curvilinear, as well as arranged as shown.

The load lock out feature is described above in connection with FIGS. 1 and 3, and involves the lower left terminal of the digital circuit unit 42 in FIG. 1. That terminal is connected through components 143, 145, and 147 to relay 24 to lock out the load 18. Load lockout is really an optional feature which is employed in one preferred embodiment of the invention. The metering system is quite useful without the load lock-out feature, and where a simpler system is desired, that feature may be omitted.

The load lockout signal from the digital circuit unit 42 is really a "battery empty" signal. This "battery empty" signal can be used in ways other than locking out load to get the strong attention of the operator, or others. For instance, the signal may be used to cause the needle of the fuel gauge voltmeter 56 to oscillate violently, or the signal may be used to sound an audible alarm. Another option is that the signal may be used to alter the control system of the forklift truck, or other vehicle, to drastically reduce the speed or the current drain of one or both of the loads rather than completely disabling a load. If the vehicle is a remotely operated vehicle which does not have an on board operator, this "empty" signal may be used to initiate the transmission of a telemetering message back to the remote control panel indicating that the vehicle batteries are depleted.

A number of the other functions shown and described in connection with this invention represent valuable features, but optional features. In many instances, the features may be considered as alternatives.

For instance, the visual display of the state of charge may be carried out with either the light emitting diodes 100, or the expanded scale voltmeter 56. However, generally both displays will not be required and will not be used, even though both could be used in a single system.

Similarly, the open circuit reset feature will generally be used in systems where it is the custom to disconnect the batteries for charging, while the high voltage reset feature will be used in systems where it is customary to recharge the batteries on board, without disconnection. Usually, one custom or the other will be followed consistently, and accordingly, both resets will not be required. However, for maximum flexibility, both open circuit reset and high voltage reset can be provided, if desired, where it is anticipated that on board charging and charging with the batteries disconnected may both be employed.

Referring again to FIG. 1, the rate input circuit involving the digital circuit unit 42 terminal R, and the auxiliary power source 142 and terminal 140 connected to various circuit components to the terminal R represents a very desirable feature, but one which need not be included in every system combination. Thus, it is very useful to be able to check the operation of the system by running the integrator at a rapid rate, but it is not essential to do so as a routine service feature. Similarly, the function associated with the test "TST" terminal is optional. That function involves applying an external oscillator to the TST terminal for the purpose of running out the high voltage reset timer 162 rapidly in order to check out the operation of the high voltage reset feature.

The power down feature associated with the "PD" terminal is extremely valuable, because it not only provides a logic signal for operation of the open circuit reset, but it also turns off all of the circuitry within the digital circuit unit 42 to conserve the auxiliary battery 116. However, conservation of the battery 116 can be omitted, if desired, and in a system which uses high voltage reset instead of open circuit reset, the power down function is not required for that feature. Accordingly, the power down features can be omitted if desired. As a matter of fact, the auxiliary memory battery 116 can be omitted if it can be postulated that the battery 10 will never be disconnected unless it is recharged before being reconnected.

It will be understood, however, that preferred embodiments of the invention do include the auxiliary battery 116, and the power down feature, and those features are strongly preferred.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A metering system for measuring and indicating the state of charge of an electrical storage battery comprising an oscillator and a digital integrator having a plurality of digital stages operable to store a numerical value in binary digital form which is indicative of state of charge, means for detecting decreases in state of charge in terms of decreases in battery terminal voltage under load and connected for providing resultant gating signals for gating pulses from said oscillator to said digital integrator, said digital integrator being operator in response to said pulses to change the numerical value stored therein in one direction as the battery is being discharged, means connected to said integrator and for deriving an analog output voltage signal representive of the numerical value stored in said integrator comprising switching means for generating a series of voltage pulses on a single output line with each pulse corresponding in length to the binary digital value stored in a predetermined number of the binary stages of said digital integrator to provide an output voltage signal having an average voltage amplitude corresponding to the length of said pulses, said means for detecting decreases in state of charge in terms of decreases in battery terminal voltage including means for detecting the terminal voltage of the battery and for generating a function of said battery terminal voltage, means connected to receive said analog output voltage signal for generating a variable reference voltage signal which is a function of said analog output voltage signal representative of the numerical value stored in said integrator, and means for comparing said last-named voltage functions as a basis for determining a battery discharge condition requiring a decrease in the state of charge indication stored by said integrator and operable to change the numerical value in said integrator, said means for detecting the terminal voltage of the battery being operable to generate a function of the battery terminal voltage which is a substantially proportional fraction of the terminal voltage, said means for generating a variable reference voltage signal comprising a resistor network which is operable to receive said integrator function generator signal and to also receive a substantially constant reference voltage signal and to generate said variable reference voltage signal as a combined function of said integrator analog output voltage signal and said constant reference voltage signal, said variable reference voltage signal being lowered as a function of said integrator analog output voltage signal as the numerical value stored in said integrator indicates progressively lower states of charge, said variable reference voltage generating means being operable to generate an offset substantially linear function of said integrator analog output voltage signal.

2. A system as claimed in claim 1 wherein said variable reference voltage generating means is adjustable to vertically translate said linear function of said integrator analog output voltage signal to selectively provide different values of voltage offset to thereby provide a higher or a lower variable reference voltage signal for each value of said integrator analog output voltage signal.

3. A system as claimed in claim 2 wherein said variable reference voltage signal generating means is additionally adjustable to selectively provide for a variation in the slope of the function of the integrator analog output voltage signal to thus provide for a greater or lesser change in said variable reference voltage signal for a given change in said integrator analog output voltage signal.

4. A system as claimed in claim 3 wherein said variable reference voltage signal generating means is provided with a single adjustment for selectively adjusting both the vertical translation and the slope of said variable reference voltage signal as a function of said integrator analog output voltage signal such that a vertical downward translation providing a general reduction in the level of the variable reference voltage signal is accompanied by an increase in the slope of said function to provide for a greater change in said variable reference voltage signal as a function of changes in said integrator analog output voltage signal which signify progressively lower states of charge.

5. A system as claimed in claim 4 wherein said resistor network comprising said variable reference voltage generating means comprises at least five resistance legs connected together in the form of a letter H with the bottom legs of the network connected together to a common ground return and with one of the top legs connected to a substantially constant reference voltage and with the other one of the top legs connected to receive said integrator analog output voltage signal, and the single adjustment for selectively changing the variable reference voltage signal as a function of said integrator analog output voltage signal comprising a resistor in the crossbar of the letter H configuration which is selectively adjustable in value.

6. A metering system for measuring and indicating the state of charge of an electrical storage battery comprising an oscillator and a digital integrator having a plurality of digital stages operable to store a numerical value in binary digital form which is indicative of state of charge, means for detecting decreases in state of charge in terms of decreases in battery terminal voltage under load and connected for providing resultant gating signals for gating pulses from said oscillator to said digital integrator, said digital integrator being operable in response to said pulses to change the numerical value stored therein in one direction as the battery is being discharged, means connected to said integrator and for deriving an analog output voltage signal representative of the numerical value stored in said integrator comprising switching means for generating a series of voltage pulses on a single output line with each pulse corresponding in length to the binary digital value stored in a predetermined number of the binary stages of said digital integrator to provide an output voltage signal having an average voltage amplitude corresponding to the length of said pulses, said means for detecting decreases in state of charge in terms of decreases in battery terminal voltage including means for detecting the terminal voltage of the battery and for generating a function of said battery terminal voltage, means connected to receive said analog output voltage signal for generating a variable reference voltage signal which is a function of said analog output voltage signal representative of the numerical value stored in said integrator, and means for comparing said last-named voltage functions as a basis for determining a battery discharge condition requiring a decrease in the state of charge indication stored by said integrator and operable to change the numerical value in said integrator, a voltage sequence responsive means operable in response to a voltage sequence including a loss of voltage to indicate disconnection of the battery followed by reestablishment of voltage to indicate reconnection of the battery, said voltage sequence responsive means including a timing means and a gating means, said voltage sequence responsive means being operable in response to said voltage sequence to enable said gating means for a limited time interval after a predetermined time delay through the operation of said timing means, means for detecting a terminal voltage of the battery which is above a threshold indicative of a charged state of the battery, said voltage threshold detecting means being connected to provide a second input to said gating means, said gating means being operable to provide an output in response to the concurrence of said two inputs, said output of said gating means being connected to reset said integrator to a value corresponding to a full state of charge.

7. A metering system for measuring and indicating the state of charge of an electric storage battery comprising a digital integrator to store a numerical value indicative of state of charge and operable to change the numerical value in one direction in response to detected decreases in state of charge as the battery is being discharged, an indicating means connected to receive signals indicative of the numerical value stored in said integrator and to provide a visual indication of that value, means for measuring the terminal voltage of the battery to detect a voltage which is elevated into the battery charging range, a timing means connected for operation in response to said elevated terminal voltage detecting means and operable to reset said integrator to a value corresponding to a full state of charge after the terminal voltage remains elevated into said battery charging range continuously for a predetermined interval of time.

8. A metering system for measuring and indicating the state of charge of an electric storage battery comprising a digital logic circuit unit which includes a digital integrator operable to store a numerical value in binary digital form which is indicative of state of charge of the battery, said digital integrator being operable to change the numerical value stored therein in one direction in response to detected decreases in state of charge as the battery is being discharged, said digital circuit unit including a digital clock controllably connectable to provide pulses to said digital integrator to change the numerical value stored therein when required, an indicating means connected to receive signals indicative of the numerical value stored in said integrator and to provide a visual indication of that value, a switching means and means for connecting power from the electric storage battery for which state of charge is being measured and indicated to said switching means, said switching means being operable to connect the power from the storage battery to said digital circuit, an auxiliary power source comprising a separate battery connected to said switching means, said switching means being operable upon disconnection of the electric storage battery being measured to switch said auxiliary power battery to supply standby power to said digital circuit to maintain the numerical value stored in said integrator, said digital circuit including a power down control circuit, said power down control circuit being connected and arranged to detect the presence or absence of voltage from the electric storage battery independent of said switching means, said power down control circuit being operable when a power down condition of the electric storage battery is detected to disable said digital clock to minimize the power drain from said auxiliary power battery.

9. A system as claimed in claim 8 wherein said digital logic circuit unit includes at least one digital clock counter and wherein said indicating means includes a digital circuit forming part of said digital logic circuit unit which includes at least one decoder connected to said integrator and operable to provide decoded output signals from said integrator on output connections from said decoder, and wherein said power down control circuit includes means to disable said digital clock counter and said decoder.

10. A metering system for measuring and indicating the state of charge of an electric storage battery, comprising a digital integrator including a digital counter to store a numerical value indicative of state of charge and operable to change count value in one direction at a predetermined maximum counting rate in response to detected decreases in state of charge as the battery is being discharged, means selectively operable to cause said counter to change count in said direction at a faster rate in response to detected decreases in state of charge, said metering system including a digital clock, said means selectively operable to cause said counter to change count at a faster rate including a frequency divider counter arranged in circuit between said clock and said integrator counter which provides frequency divided clocking pulses to said integrator counter to normally maintain the counting rate of said integrator counter at said predetermined maximum counting rate, and said selectively operable means also including means for receiving a separate rate control logic input signal and including gating means connected between said frequency divider counter and said integrator counter, said rate control logic means and said gating means being operable to bypass said frequency divider to supply undivided clock pulses to said integrator counter for operation at a faster rate.

11. A metering system for measuring and indicating the state of charge of an electrical storage battery comprising an integrated digital circuit unit including an oscillator and a digital integrator having a plurality of digital stages operable to store a numerical value in binary digital form which is indicative of state of charge, means for detecting decreases in state of charge in terms of decreases in battery terminal voltage under load and connected for providing resultant gating signals for gating pulses from said oscillator to said digital integrator, said digital integrator being operable in response to said pulses to change the numerical value stored therein in one direction as the battery is being discharged, means connected to said integrator and incorporated in said integrated circuit for deriving an analog output voltage signal representative of the numerical value stored in said integrator comprising switching means for generating a series of voltage pulses on a single output line with each pulse corresponding in length to the binary digital value stored in a predetermined number of the binary stages of said digital integrator to provide an output voltage signal having an average voltage amplitude corresponding to the length of said pulses, said means for detecting decreases in state of charge in terms of decreases in battery terminal voltage including means for detecting the terminal voltage of the battery and for generating a function of said battery terminal voltage, means connected to receive said analog output voltage signal for generating a variable reference voltage signal which is a function of said analog output voltage signal representative of the numerical value stored in said integrator, and means for comparing said last-named voltage functions as a basis for determining a battery discharge condition requiring a decrease in the state of charge indication stored by said integrator and operable to change the numerical value in said integrator, said integrated digital circuit unit including a digital one out of N decoder connected to said integrator and having N outputs to indicate different numerical values stored in said integrator in terms of output signals appearing one at a time on different ones of said N outputs, a linearly arranged array of N discrete fixed-position indicating devices connected to said integrated digital circuit unit to receive the respective N outputs of said decoder, each of said indicating devices being operable to provide a visual indication in response to an output signal from the associated output of said decoder, the connections of said decoder outputs to said array and the operation of said one out N decoder being such as to provide for energization of one of said indicating devices at a time to indicate different values of state of charge in terms of different numbers stored in said digital integrator, said different values being indicated in a progression along said linear array to thereby simulate the movement of a galvanic meter pointer in moving from one end of said array for indicating a full state of charge to the other end of said array for indicating a depleted state of charge.

12. A system as claimed in claim 11 wherein said indicating devices each consist of a light emitting diode.

13. A system as claimed in claim 12 wherein said light emitting diodes are combined in an array containing a substantial number of separate diodes arranged in an optical display wherein the illumination from each diode is in a relatively narrow rectangular shape, the longer sides of the rectangular shapes for adjacent diodes being arranged adjacent to one another and the short sides of the rectangular shapes for each diode being arranged in substantial alignment with the corresponding short sides of adjacent diode display rectangles.

14. A system as claimed in claim 13 wherein a meter scale is provided and positioned with said diode array so that the meter scale is readily visible along with the diode display to further simulate a galvanic meter.

15. A system as claimed in claim 14 wherein the rectangular light emitting diode apertures are spaced at intervals which are different from the spaced intervals of the scale markings of said meter scale to thereby further simulate a galvanic meter.

16. A system as claimed in claim 11 wherein a circuit means is provided for periodically interrupting the energization of the one of said indicating devices at the end of said array indicating a depleted state of charge to thereby cause that indicating device to be intermittently energized to provide a flashing signal indication when the state of charge has been depleted.

17. A system as claimed in claim 16 wherein said circuit means for providing for intermittent energization of the indicating device indicating a depleted state of charge is also connected to cause intermittent energization of the next adjacent indicating device which indicates that the charge is almost depleted, and said circuit means being operable when the charge is depleted to energize both of said last mentioned indicating devices in an alternating sequence.

18. A system as claimed in claim 1 which is automatically adjustable for operation with batteries having either one of a first or a second predetermined number of cells and having two respectively corresponding different rated voltages, said means for detecting the battery terminal voltage and for generating a function of said terminal voltage comprising a voltage divider for generating a voltage which is a predetermined fraction of said battery terminal voltage, said voltage divider being operable to normally provide the desired fraction of said terminal voltage at a predetermined range of values for a battery having said first predetermined number of cells, said system including means for detecting a battery terminal voltage which is beyond a predetermined voltage threshold indicative of the presence of a range of battery terminal voltages typifying said second predetermined number of battery cells, and a range switching circuit connected to said battery terminal voltage threshold device for operation when said second known number of battery cells is detected to switch another impedance into said voltage divider to recalibrate said voltage divider to provide the desired range of voltage functions to said voltage comparison means with said second known number of battery cells.

19. A system as claimed in claim 18 wherein said range switching circuit includes means for maintaining the switching of said other impedance into said voltage divider to maintain the recalibration of said voltage divider until the battery is disconnected.

20. A system as claimed in claim 18 wherein said second known number of battery cells is greater than said first known number of battery cells so that the battery terminal voltage is higher with said second known number of battery cells and said battery terminal voltage threshold device is therefore operable for voltages above a threshold indicating the presence of said second known number of battery cells.

21. A metering system for measuring and indicating the state of charge of an electrical storage battery comprising an oscillator and a digital integrator having a plurality of digital stages operable to store a numerical value in binary digital form which is indicative of state of charge, means for detecting decreases in state of charge in terms of decreases in battery terminal voltage under load and connected for providing resultant gating signals for gating pulses from said oscillator to said digital integrator, said digital integrator being operable in response to said pulses to change the numerical value stored therein in one direction as the battery is being discharged, means connected to said integrator and for deriving an analog output voltage signal representative of the numerical value stored in said integrator comprising switching means for generating a series of voltage pulses on a single output line with each pulse corresponding in length to the binary digital value stored in a predetermined number of the binary stages of said digital integrator to provide an output voltage signal having an average voltage amplitude corresponding to the length of said pulses, said means for detecting decreases in state of charge in terms of decreases in battery terminal voltage including means for detecting the terminal voltage of the battery and for generating a function of said battery terminal voltage, means connected to receive said analog output voltage signal for generating a variable reference voltage signal which is a function of said analog output voltage signal representative of the numerical value stored in said integrator, and means for comparing said last-named voltage functions as a basis for determining a battery discharge condition requiring a decrease in the state of charge indication stored by said integrator and operable to change the numerical value in said integrator, said metering system being automatically adjustable for operation with batteries having either one of a first or a second predetermined number of cells and having two respectively corresponding different rated voltages, said means for detecting the battery terminal voltage and for generating a function of said terminal voltage comprising a voltage divider for generating a voltage which is a predetermined fraction of said battery terminal voltage, said voltage divider being operable to normally provide the desired fraction of said terminal voltage at a predetermined range of values for a battery having said first predetermined number of cells, said system including means for detecting a battery terminal voltage which is beyond a predetermined voltage threshold indicative of the presence of a range of battery terminal voltages typifying said second predetermined number of battery cells, and a range switching circuit connected to said battery terminal voltage threshold device for operation when said second known number of battery cells is detected to switch another impedence into said voltage divider to recalibrate said voltage divider to provide the desired range of voltage functions to said voltage comparison means with said second known number of battery cells, said second known number of battery cells being greater than said first known number of battery cells so that the battery terminal voltage is higher with said second known number of battery cells and said battery terminal voltage threshold device is therefore operable for voltage above a threshold indicating the presence of said second known number of battery cells, a voltage sequence responsive means operable in response to a voltage sequence including a loss of voltage to indicate disconnection of the battery followed by reestablishment of voltage to indicate reconnection of the battery, said voltage sequence responsive means including a timing means and a gating means, said voltage sequence responsive means being operable in response to said voltage sequence to enable said gating means for a limited time interval after a first predetermined time delay through the operation of said timing means, means connected to said voltage divider for detecting a terminal voltage of the battery in terms of the output from said voltage divider which is above a threshold indicative of a charged state of the battery, said voltage threshold detecting means being connected to provide a second input to said gating means, said gating means being operable to provide an output in response to the concurrence of said two inputs, said output of said gating means being connected to reset said integrator to a value corresponding to a full state of charge, said range switching circuit including a second timing means for delaying the operation of said range switching circuit for a second predetermined time delay interval to avoid false operation in response to initial switching transients, said second predetermined time delay being substantially less than said first predetermined time delay to insure that said range switching circuit is operable to recalibrate said voltage divider for said second known number of battery cells prior to the resetting of said integrator by said gating means to avoid a false operation of said gating means in mistakenly detecting the higher voltage available from said second known number of battery cells as indicative of a battery having said first predetermined number of cells in a charged state.

22. A system as claimed in claim 21 wherein said range switching circuit includes a third timing means and a switching means connected for operation in response to said third timing means to lock out said range switching circuit at a predetermined interval after the connection of the battery in order to prevent a later false initiation of the operation of said range switching circuit due to temporary over voltage conditions.

23. A method for measuring and indicating the state of charge of an electric storage battery comprising storing a numerical value in a binary digital form which is indicative of state of charge, changing the stored numerical value in one direction in response to detected decreases in state of charge as the battery is being discharged, deriving an analog output voltage signal proportional to the numerical stored value in said integrator by generating a series of voltage pulses on a single output line with each pulse corresponding in length to the stored binary digital value to provide a time-based resultant indication of the stored binary digital value, filtering the pulses to provide a substantially smooth analog output voltage signal having a voltage amplitude corresponding to the duration of said pulses, detecting the terminal voltage of the battery and generating a function of said battery terminal voltage, generating a variable reference voltage signal which is a function of said analog output voltage signal representative of the stored numerical value, comparing said last-named voltage functions as a basis for determining a battery condition requiring a change in the stored numerical value state of charge indication, and wherein the generated function of the battery terminal voltage is a substantially proportional fraction of the terminal voltage, and wherein the variable reference voltage signal is generated as a combined function of said analog output voltage signal and a constant reference voltage signal, the variable reference voltage signal being lowered as a function of said analog output voltage signal as the numerical value stored indicates progressively lower stages of charge, and wherein said variable reference voltage signal is generated as an offset substantially linear function of said analog output voltage signal.

24. A system as claimed in claim 1 wherein said oscillator and said digital integrator and said means for deriving an analog output voltage signal are all included in an integrated digital circuit unit.

* * * * *

UNITED STATES PATENT AND TRADEMARK OFFICE
CERTIFICATE OF CORRECTION

PATENT NO. : 4,560,937
DATED : Dec. 24, 1985
INVENTOR(S) : Eugene P. Finger

It is certified that error appears in the above-identified patent and that said Letters Patent are hereby corrected as shown below:

Column 24, line 36, "operator" should read --operable--.

Signed and Sealed this

Twenty-second Day of April 1986

[SEAL]

Attest:

DONALD J. QUIGG

Attesting Officer

Commissioner of Patents and Trademarks